United States Patent
Wedding et al.

(10) Patent No.: US 8,129,906 B1
(45) Date of Patent: *Mar. 6, 2012

(54) LUMINO-SHELLS

(75) Inventors: Carol Ann Wedding, Toledo, OH (US); Oliver M. Strbik, III, Holland, OH (US)

(73) Assignee: Imaging Systems Technology, Inc., Toledo, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/393,692

(22) Filed: Feb. 26, 2009

Related U.S. Application Data

(60) Continuation-in-part of application No. 12/172,646, filed on Jul. 14, 2008, now Pat. No. 7,833,076, which is a division of application No. 11/107,964, filed on Apr. 18, 2005, now Pat. No. 7,405,516, and a continuation-in-part of application No. 11/107,964, filed on Apr. 18, 2005, now Pat. No. 7,405,516.

(60) Provisional application No. 60/564,942, filed on Apr. 26, 2004, provisional application No. 61/032,939, filed on Feb. 29, 2008.

(51) Int. Cl.
    *H01J 17/49* (2006.01)
(52) U.S. Cl. ..................... 313/582; 313/486
(58) Field of Classification Search .......... None
     See application file for complete search history.

(56) References Cited

U.S. PATENT DOCUMENTS

| | | |
|---|---|---|
| 2,187,432 A | 1/1940 | Powers |
| 2,644,113 A | 6/1953 | Etzkorn |
| 3,050,654 A | 8/1962 | Toulon |
| 3,177,161 A | 4/1965 | Smith-Johannsen |
| 3,264,073 A | 8/1966 | Schmitt et al. |
| 3,365,315 A | 1/1968 | Beck et al. |
| 3,423,489 A | 1/1969 | Arens |
| 3,528,809 A | 9/1970 | Farnand |
| 3,602,754 A | 8/1971 | Pfaender et al. |
| 3,607,169 A | 9/1971 | Cox |
| 3,646,384 A | 2/1972 | Lay |
| 3,652,891 A | 3/1972 | Janning |
| 3,654,680 A | 4/1972 | Bode et al. |
| 3,666,981 A | 5/1972 | Lay |
| 3,674,461 A | 7/1972 | Farnand et al. |
| 3,699,050 A | 10/1972 | Henderson |
| 3,755,027 A | 8/1973 | Gilsing |
| 3,769,543 A | 10/1973 | Pennebaker |
| 3,792,136 A | 2/1974 | Schmitt |
| 3,793,041 A | 2/1974 | Sowman |
| 3,794,503 A | 2/1974 | Netting |
| 3,796,777 A | 3/1974 | Netting |
| 3,811,061 A | 5/1974 | Nakayama et al. |
| 3,836,810 A | 9/1974 | Johnns et al. |
| 3,838,307 A | 9/1974 | Masi |

(Continued)

FOREIGN PATENT DOCUMENTS

JP 2002373588 12/2002

*Primary Examiner* — Ashok Patel
(74) *Attorney, Agent, or Firm* — Donald K. Wedding

(57) ABSTRACT

A display device constructed out of one or more lumino-shells with an organic luminescent substance(s) located in and/or on each shell, the organic luminescent substance emitting light when excited by electric current. Inorganic luminescent substance(s) may be combined with the organic luminescent substance(s). The lumino-shell includes lumino-sphere, lumino-dome, and lumino-disk.

11 Claims, 23 Drawing Sheets

U.S. PATENT DOCUMENTS

| | | |
|---|---|---|
| 3,838,998 A | 10/1974 | Matthews et al. |
| 3,848,248 A | 11/1974 | MacIntyre |
| 3,855,951 A | 12/1974 | Giles |
| 3,860,846 A | 1/1975 | Mayer |
| 3,873,870 A | 3/1975 | Fukushima et al. |
| 3,885,195 A | 5/1975 | Amano |
| 3,886,395 A | 5/1975 | Eukushima et al. |
| 3,888,957 A | 6/1975 | Netting |
| 3,904,915 A | 9/1975 | Hinson |
| 3,916,245 A | 10/1975 | Dorf et al. |
| 3,916,584 A | 11/1975 | Howard et al. |
| 3,925,697 A | 12/1975 | Fein et al. |
| 3,927,181 A | 12/1975 | Niimi et al. |
| 3,927,342 A | 12/1975 | Bode et al. |
| 3,933,679 A | 1/1976 | Weitzel et al. |
| 3,935,494 A | 1/1976 | Dick et al. |
| 3,939,822 A | 2/1976 | Markowitz |
| 3,954,678 A | 5/1976 | Marquisee |
| 3,964,050 A | 6/1976 | Mayer |
| 3,969,718 A | 7/1976 | Strom |
| 3,975,194 A | 8/1976 | Farnand et al. |
| 3,990,068 A | 11/1976 | Mayer et al. |
| 3,998,618 A | 12/1976 | Kreick et al. |
| 4,017,290 A | 4/1977 | Budrick et al. |
| 4,021,253 A | 5/1977 | Budrick et al. |
| 4,027,188 A | 5/1977 | Bergman |
| 4,027,191 A | 5/1977 | Schaufele et al. |
| 4,035,690 A | 7/1977 | Roeber |
| 4,038,577 A | 7/1977 | Bode et al. |
| 4,048,533 A | 9/1977 | Hinson et al. |
| 4,059,423 A | 11/1977 | De Vos et al. |
| 4,060,749 A | 11/1977 | Shinada et al. |
| 4,075,025 A | 2/1978 | Rostoker |
| 4,106,009 A | 8/1978 | Dick |
| 4,111,713 A | 9/1978 | Beck |
| 4,119,422 A | 10/1978 | Rostoker |
| 4,126,807 A | 11/1978 | Wedding et al. |
| 4,126,809 A | 11/1978 | Wedding et al. |
| 4,133,854 A | 1/1979 | Hendricks |
| 4,163,637 A | 8/1979 | Hendricks |
| 4,164,678 A | 8/1979 | Biazzo et al. |
| 4,166,147 A | 8/1979 | Lange et al. |
| 4,257,798 A | 3/1981 | Hendricks et al. |
| 4,279,632 A | 7/1981 | Frosch et al. |
| 4,290,847 A | 9/1981 | Johnson et al. |
| 4,303,061 A | 12/1981 | Torobin |
| 4,303,431 A | 12/1981 | Torobin |
| 4,303,432 A | 12/1981 | Torobin |
| 4,303,433 A | 12/1981 | Torobin |
| 4,303,603 A | 12/1981 | Torobin |
| 4,303,729 A | 12/1981 | Torobin |
| 4,303,730 A | 12/1981 | Torobin |
| 4,303,731 A | 12/1981 | Torobin |
| 4,303,732 A | 12/1981 | Torobin |
| 4,303,736 A | 12/1981 | Torobin |
| 4,307,051 A | 12/1981 | Sargeant et al. |
| 4,314,827 A | 2/1982 | Leitheiser et al. |
| 4,322,378 A | 3/1982 | Hendricks |
| 4,340,642 A | 7/1982 | Netting et al. |
| 4,344,787 A | 8/1982 | Beggs et al. |
| 4,349,456 A | 9/1982 | Sowman |
| 4,356,429 A | 10/1982 | Tang |
| 4,363,646 A | 12/1982 | Torobin |
| 4,391,646 A | 7/1983 | Howell |
| 4,392,988 A | 7/1983 | Dobson et al. |
| 4,415,512 A | 11/1983 | Torobin |
| 4,459,145 A | 7/1984 | Elsholz |
| 4,494,038 A | 1/1985 | Wedding et al. |
| 4,525,314 A | 6/1985 | Torobin |
| 4,542,066 A | 9/1985 | Delzant |
| 4,547,233 A | 10/1985 | Delzant |
| 4,548,196 A | 10/1985 | Torobin |
| 4,548,767 A | 10/1985 | Hendricks |
| 4,563,617 A | 1/1986 | Davidson |
| 4,568,389 A | 2/1986 | Torobin |
| 4,582,534 A | 4/1986 | Torobin |
| 4,596,681 A | 6/1986 | Grossman et al. |
| 4,618,525 A | 10/1986 | Chamberlain et al. |
| 4,637,990 A | 1/1987 | Torobin |
| 4,638,218 A | 1/1987 | Shinoda et al. |
| 4,671,909 A | 6/1987 | Torobin |
| 4,713,300 A | 12/1987 | Sowman et al. |
| 4,720,432 A | 1/1988 | VanSlyke et al. |
| 4,737,687 A | 4/1988 | Shinoda et al. |
| 4,743,511 A | 5/1988 | Sowman et al. |
| 4,743,545 A | 5/1988 | Torobin |
| 4,744,831 A | 5/1988 | Beck |
| 4,757,036 A | 7/1988 | Kaar et al. |
| 4,769,292 A | 9/1988 | Tang et al. |
| 4,775,598 A | 10/1988 | Jaeckel |
| 4,777,154 A | 10/1988 | Torobin |
| 4,778,502 A | 10/1988 | Garnier et al. |
| 4,782,097 A | 11/1988 | Jain et al. |
| 4,793,980 A | 12/1988 | Torobin |
| 4,797,378 A | 1/1989 | Sowman |
| 4,800,180 A | 1/1989 | McAllister et al. |
| 4,853,590 A | 8/1989 | Andreadakis |
| 4,859,711 A | 8/1989 | Jain et al. |
| 4,865,875 A | 9/1989 | Kellerman |
| 4,879,321 A | 11/1989 | Laroche |
| 4,883,779 A | 11/1989 | McAllister et al. |
| 4,917,857 A | 4/1990 | Jaeckel et al. |
| 4,948,573 A | 8/1990 | Nadkarni et al. |
| 4,960,351 A | 10/1990 | Kendall et al. |
| 4,963,792 A | 10/1990 | Parker |
| 4,968,571 A | 11/1990 | Gruenbaum et al. |
| 5,017,316 A | 5/1991 | Sowman |
| 5,053,436 A | 10/1991 | Delgado |
| 5,055,240 A | 10/1991 | Lee et al. |
| 5,069,702 A | 12/1991 | Block et al. |
| 5,077,241 A | 12/1991 | Moh et al. |
| 5,093,691 A | 3/1992 | Utsugi et al. |
| 5,114,695 A | 5/1992 | Jain et al. |
| 5,151,629 A | 9/1992 | VanSlyke |
| 5,176,732 A | 1/1993 | Block et al. |
| 5,185,299 A | 2/1993 | Wood et al. |
| 5,198,479 A | 3/1993 | Shiobara et al. |
| 5,212,143 A | 5/1993 | Torobin |
| 5,225,123 A | 7/1993 | Torobin |
| 5,246,683 A | 9/1993 | Parent et al. |
| 5,247,190 A | 9/1993 | Friend et al. |
| 5,260,002 A | 11/1993 | Wang |
| 5,326,298 A | 7/1994 | Hotomi |
| 5,354,825 A | 10/1994 | Klainer et al. |
| 5,397,759 A | 3/1995 | Torobin |
| 5,399,502 A | 3/1995 | Friend et al. |
| 5,409,783 A | 4/1995 | Tang et al. |
| 5,480,723 A | 1/1996 | Klainer et al. |
| 5,487,390 A | 1/1996 | Cohen et al. |
| 5,500,287 A | 3/1996 | Henderson |
| 5,501,871 A | 3/1996 | Henderson |
| 5,534,348 A | 7/1996 | Miller et al. |
| 5,540,999 A | 7/1996 | Yamamoto et al. |
| 5,563,424 A | 10/1996 | Yang et al. |
| 5,625,256 A | 4/1997 | Tiedt et al. |
| 5,644,327 A | 7/1997 | Onyskevych et al. |
| 5,645,948 A | 7/1997 | Shi et al. |
| 5,683,823 A | 11/1997 | Shi et al. |
| 5,693,808 A | 12/1997 | Langhals |
| 5,700,897 A | 12/1997 | Klainer et al. |
| 5,755,999 A | 5/1998 | Shi et al. |
| 5,777,436 A | 7/1998 | Lepselter |
| 5,793,158 A | 8/1998 | Wedding |
| 5,804,836 A | 9/1998 | Heeger et al. |
| 5,807,627 A | 9/1998 | Friend et al. |
| 5,882,779 A | 3/1999 | Lawandy |
| 5,900,327 A | 5/1999 | Pei et al. |
| 5,908,581 A | 6/1999 | Chen et al. |
| 5,932,968 A | 8/1999 | Ghosh et al. |
| 5,939,826 A | 8/1999 | Ohsawa et al. |
| 5,984,747 A | 11/1999 | Bhagavatula et al. |
| 6,020,078 A | 2/2000 | Chen et al. |
| 6,055,038 A | 4/2000 | Asano |
| 6,069,442 A | 5/2000 | Hung et al. |
| 6,149,072 A | 11/2000 | Tseng |
| 6,176,584 B1 | 1/2001 | Best et al. |
| 6,184,848 B1 | 2/2001 | Weber |

| | | |
|---|---|---|
| 6,208,791 B1 | 3/2001 | Bischel et al. |
| 6,255,777 B1 | 7/2001 | Kim et al. |
| 6,303,238 B1 | 10/2001 | Thompson et al. |
| 6,344,284 B1 | 2/2002 | Chou |
| 6,348,359 B1 | 2/2002 | Van Slyke |
| 6,361,885 B1 | 3/2002 | Chou |
| 6,368,708 B1 | 4/2002 | Brown et al. |
| 6,376,995 B1 | 4/2002 | Kato et al. |
| 6,377,387 B1 | 4/2002 | Duthaler et al. |
| 6,402,985 B1 | 6/2002 | Hsu et al. |
| 6,479,172 B2 | 11/2002 | Hu et al. |
| 6,524,760 B1 | 2/2003 | Ikeuchi et al. |
| 6,528,188 B1 | 3/2003 | Suzuki et al. |
| 6,528,952 B2 | 3/2003 | Kato et al. |
| 6,538,263 B1 | 3/2003 | Park et al. |
| 6,545,422 B1 | 4/2003 | George et al. |
| 6,570,335 B1 | 5/2003 | George et al. |
| 6,610,554 B2 | 8/2003 | Yi et al. |
| 6,612,889 B1 | 9/2003 | Green et al. |
| 6,614,175 B2 | 9/2003 | Aziz et al. |
| 6,620,012 B1 | 9/2003 | Johnson et al. |
| 6,633,117 B2 | 10/2003 | Shinoda et al. |
| 6,646,388 B2 | 11/2003 | George et al. |
| 6,650,055 B2 | 11/2003 | Ishimoto et al. |
| 6,670,645 B2 | 12/2003 | Grushin et al. |
| 6,677,704 B2 | 1/2004 | Ishimoto et al. |
| 6,692,326 B2 | 2/2004 | Choi et al. |
| 6,693,389 B2 | 2/2004 | Marcotte et al. |
| 6,720,090 B2 | 4/2004 | Young et al. |
| 6,762,566 B2 | 7/2004 | George et al. |
| 6,764,367 B2 | 7/2004 | Green et al. |
| 6,765,237 B1 | 7/2004 | Doxsee et al. |
| 6,768,478 B1 | 7/2004 | Wani et al. |
| 6,781,309 B2 * | 8/2004 | Choi et al. ................... 313/586 |
| 6,791,264 B2 | 9/2004 | Green et al. |
| 6,794,265 B2 | 9/2004 | Lee et al. |
| 6,794,812 B2 | 9/2004 | Yamada et al. |
| 6,796,867 B2 | 9/2004 | George et al. |
| 6,801,001 B2 | 10/2004 | Drobot et al. |
| 6,822,626 B2 | 11/2004 | George et al. |
| 6,836,063 B2 | 12/2004 | Ishimoto et al. |
| 6,836,064 B2 | 12/2004 | Yamada et al. |
| 6,841,929 B2 | 1/2005 | Ishimoto et al. |
| 6,853,144 B2 | 2/2005 | Marcotte |
| 6,857,923 B2 | 2/2005 | Yamada et al. |
| 6,857,925 B2 | 2/2005 | Kawamura et al. |
| 6,864,631 B1 * | 3/2005 | Wedding ................... 313/587 |
| 6,893,677 B2 | 5/2005 | Yamada et al. |
| 6,902,456 B2 | 6/2005 | George et al. |
| 6,914,382 B2 | 7/2005 | Ishimoto et al. |
| 6,930,442 B2 | 8/2005 | Awamoto et al. |
| 6,932,664 B2 | 8/2005 | Yamada et al. |
| 6,935,913 B2 | 8/2005 | Wyeth et al. |
| 6,969,292 B2 | 11/2005 | Tokai et al. |
| 6,975,068 B2 | 12/2005 | Green et al. |
| 7,005,793 B2 | 2/2006 | George et al. |
| 7,025,648 B2 | 4/2006 | Green et al. |
| 7,049,748 B2 | 5/2006 | Tokai et al. |
| 7,083,681 B2 | 8/2006 | Yamada et al. |
| 7,122,961 B1 | 10/2006 | Wedding |
| 7,125,305 B2 | 10/2006 | Green et al. |
| 7,135,767 B2 | 11/2006 | Wong et al. |
| 7,137,857 B2 | 11/2006 | George et al. |
| 7,140,941 B2 | 11/2006 | Green et al. |
| 7,157,854 B1 | 1/2007 | Wedding |
| 7,176,628 B1 | 2/2007 | Wedding |
| 7,208,203 B2 | 4/2007 | Yamada et al. |
| 7,247,989 B1 | 7/2007 | Wedding |
| 7,288,014 B1 | 10/2007 | George et al. |
| 7,307,602 B1 | 12/2007 | Wedding et al. |
| 7,375,342 B1 | 5/2008 | Wedding |
| 7,405,516 B1 * | 7/2008 | Wedding ................... 313/582 |
| 7,456,571 B1 | 11/2008 | Wedding |
| 7,535,175 B1 | 5/2009 | Strbik, III et al. |
| 7,589,697 B1 | 9/2009 | Guy et al. |
| 7,595,774 B1 | 9/2009 | Wedding et al. |
| 7,604,523 B1 | 10/2009 | Wedding et al. |
| 7,619,591 B1 | 11/2009 | Guy et al. |
| 7,622,866 B1 | 11/2009 | Wedding et al. |
| 7,628,666 B1 | 12/2009 | Strbik, III et al. |
| 7,638,943 B1 | 12/2009 | Wedding et al. |
| 7,679,286 B1 | 3/2010 | Wedding |
| 7,719,471 B1 | 5/2010 | Pavliscak et al. |
| 2001/0028216 A1 | 10/2001 | Tokai et al. |
| 2002/0004111 A1 | 1/2002 | Matsubara |
| 2002/0030437 A1 | 3/2002 | Shimizu et al. |
| 2002/0041156 A1 | 4/2002 | Juestel et al. |
| 2002/0063525 A1 * | 5/2002 | Choi et al. ................... 313/582 |
| 2002/0101151 A1 | 8/2002 | Choi et al. |
| 2002/0106501 A1 | 8/2002 | Debe |
| 2003/0003225 A1 | 1/2003 | Choi et al. |
| 2003/0052596 A1 | 3/2003 | Yi et al. |
| 2003/0122485 A1 | 7/2003 | Tokai et al. |
| 2003/0164684 A1 | 9/2003 | Green et al. |
| 2003/0182967 A1 | 10/2003 | Tokai et al. |
| 2003/0184212 A1 | 10/2003 | Ishimoto et al. |
| 2003/0214243 A1 | 11/2003 | Drobot et al. |
| 2004/0009367 A1 | 1/2004 | Hatwar |
| 2004/0023010 A1 | 2/2004 | Bulovic et al. |
| 2004/0033319 A1 | 2/2004 | Yamada et al. |
| 2004/0063373 A1 | 4/2004 | Johnson et al. |
| 2004/0149943 A1 | 8/2004 | Field |
| 2004/0175854 A1 | 9/2004 | George et al. |
| 2004/0234902 A1 | 11/2004 | Toyoda et al. |
| 2005/0022905 A1 | 2/2005 | Wong et al. |
| 2005/0095944 A1 | 5/2005 | George et al. |
| 2006/0097620 A1 | 5/2006 | George et al. |
| 2006/0158112 A1 | 7/2006 | Hur et al. |
| 2006/0202309 A1 | 9/2006 | Wong et al. |
| 2007/0015431 A1 | 1/2007 | Green et al. |
| 2007/0103078 A1 * | 5/2007 | Son et al. ................... 313/587 |

* cited by examiner

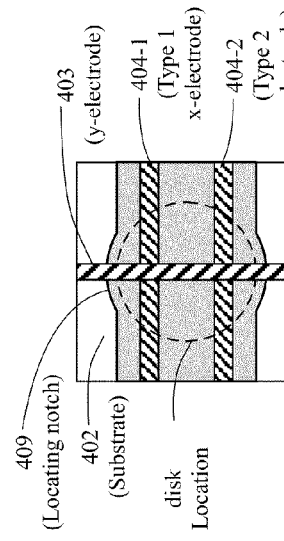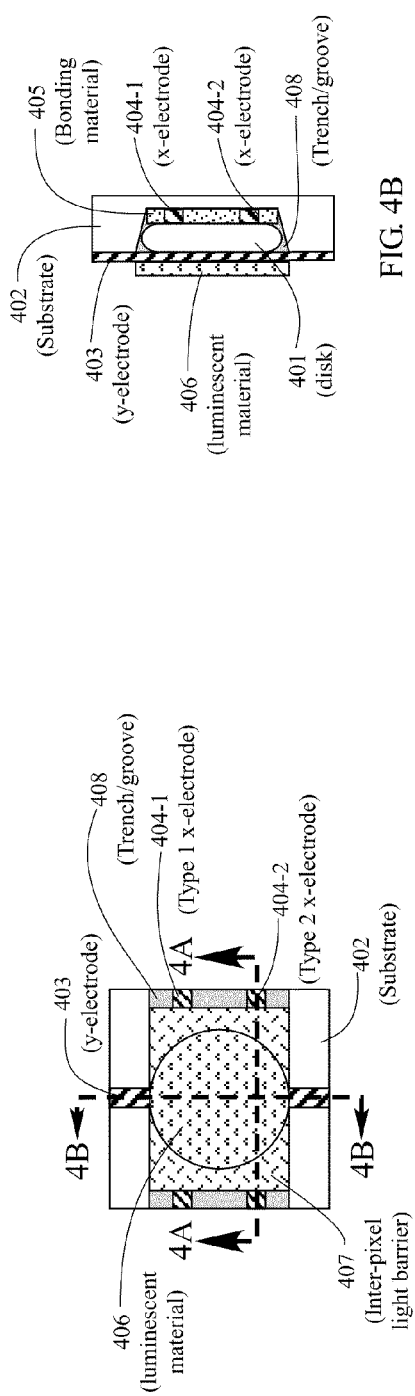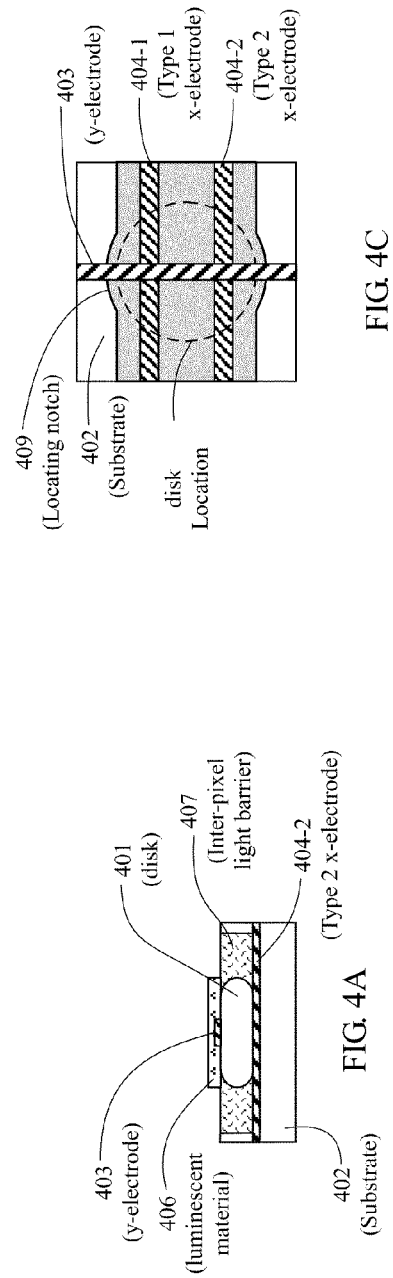

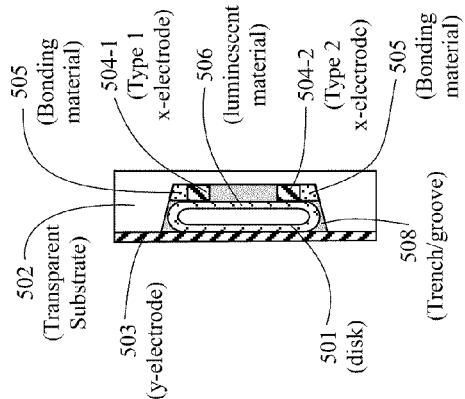
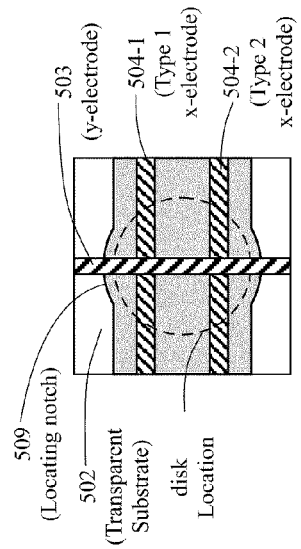
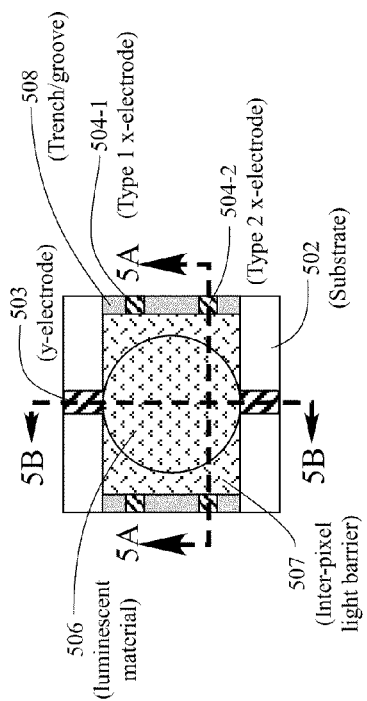
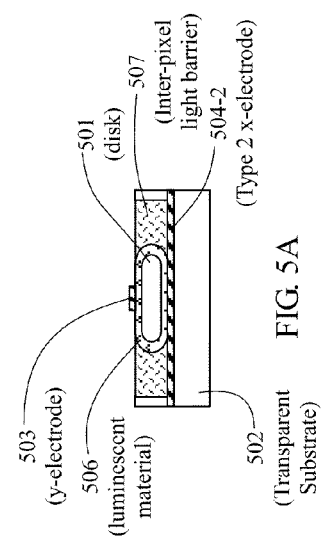

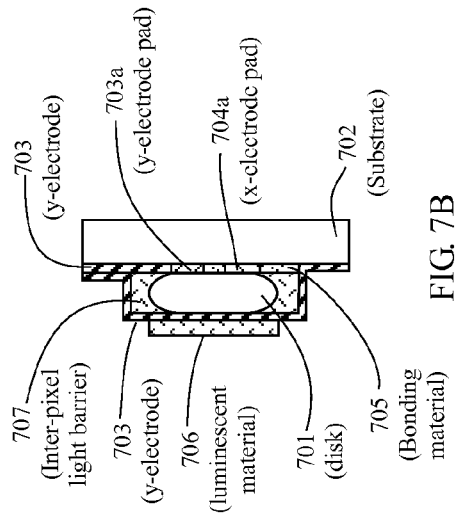
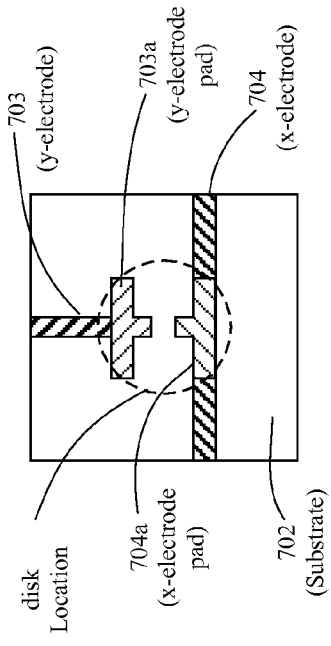
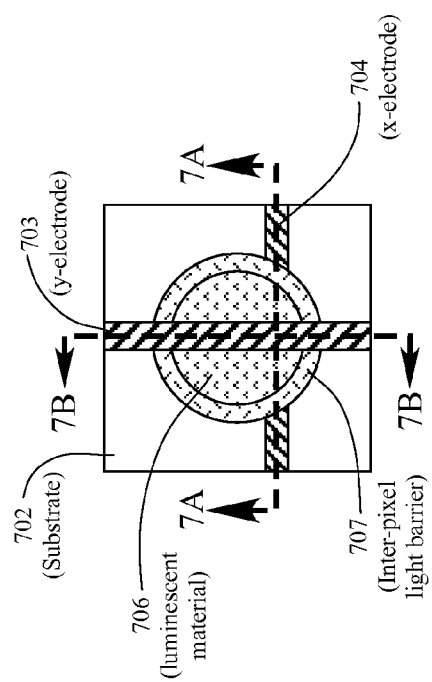
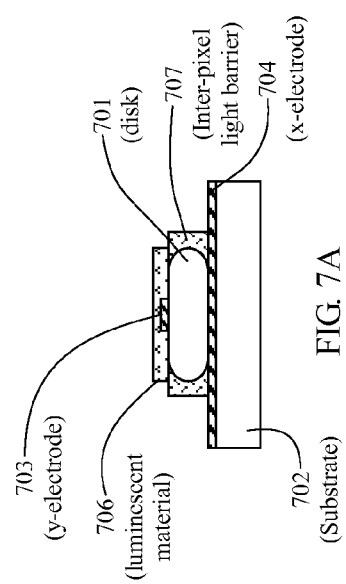
FIG. 7
FIG. 7B
FIG. 7C
FIG. 7A

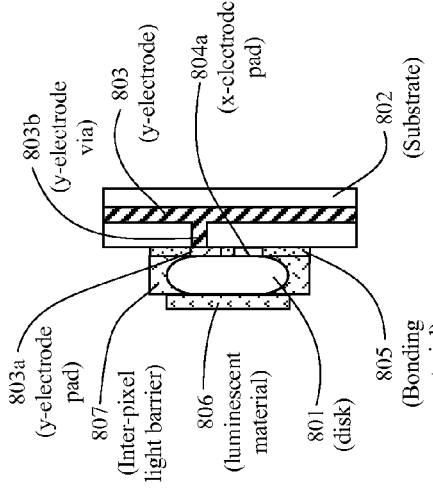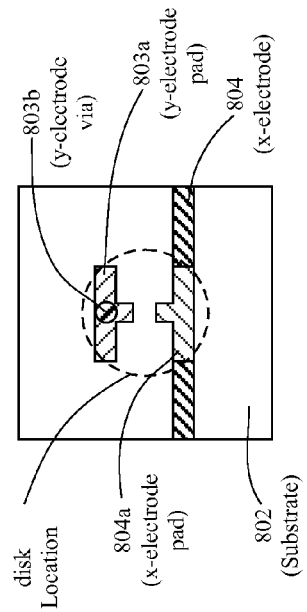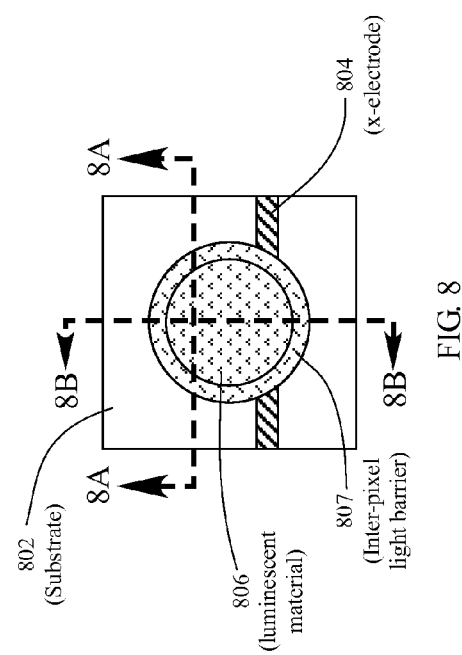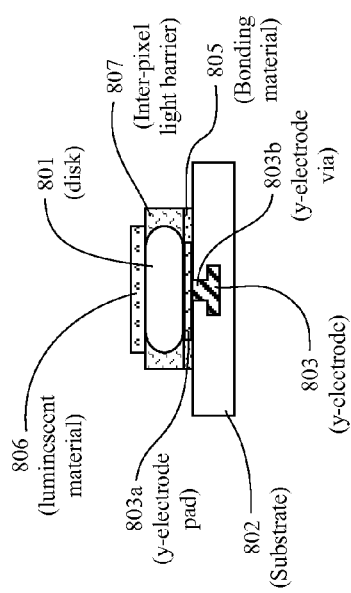

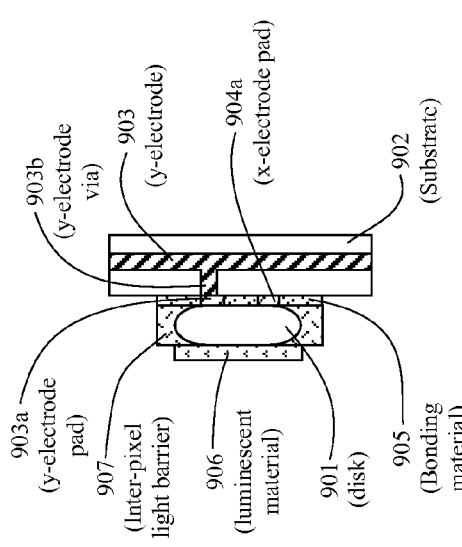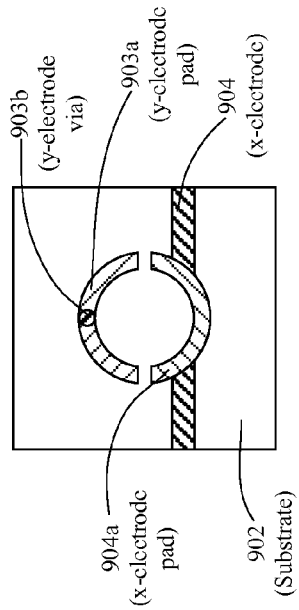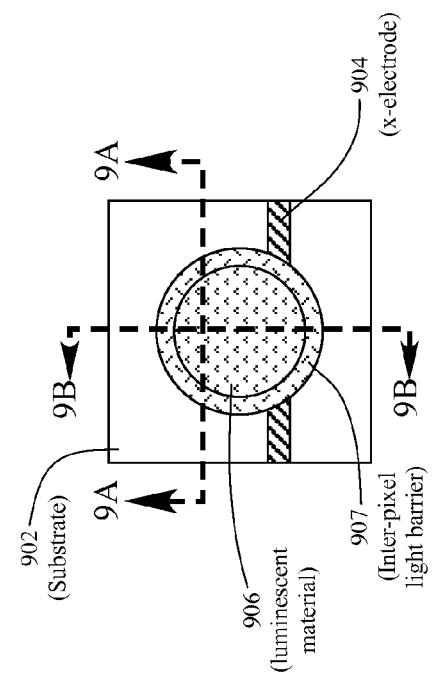

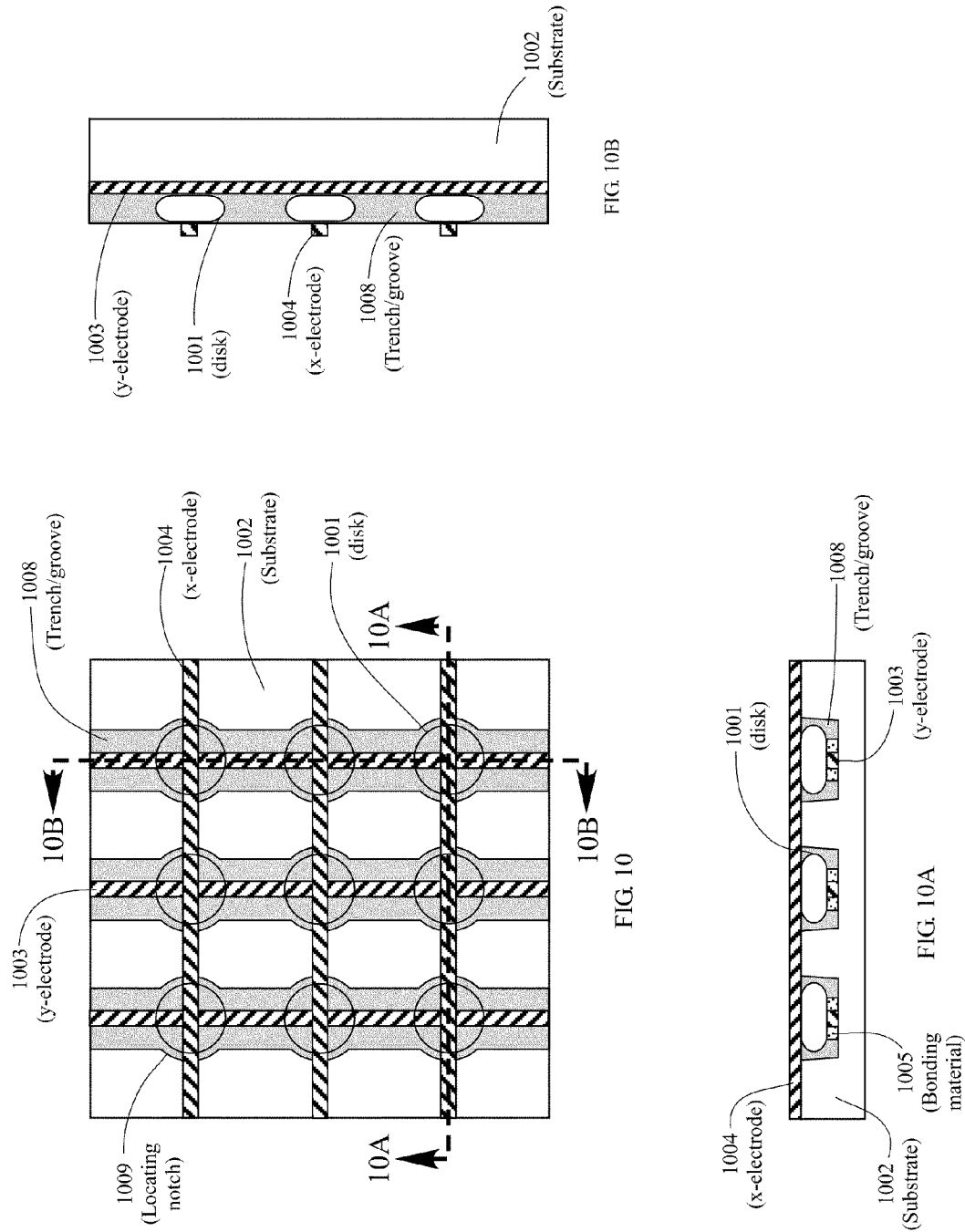

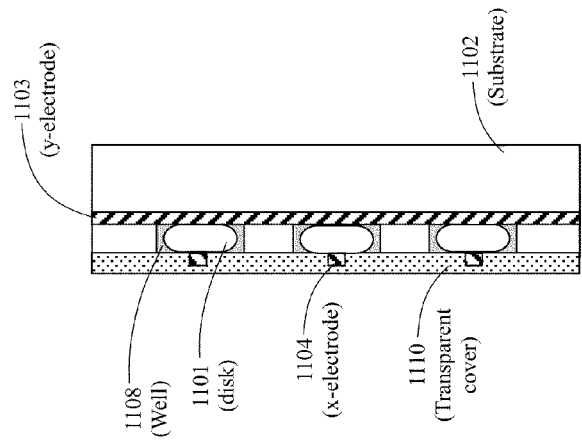
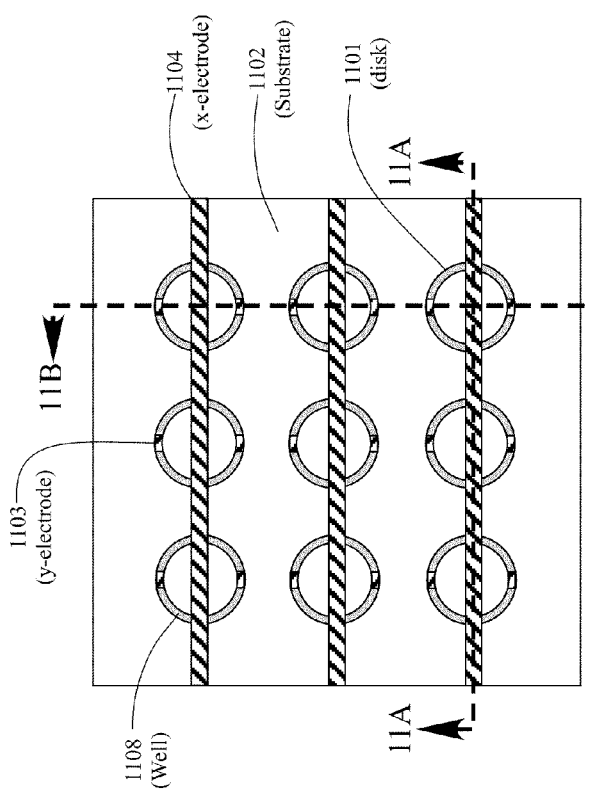
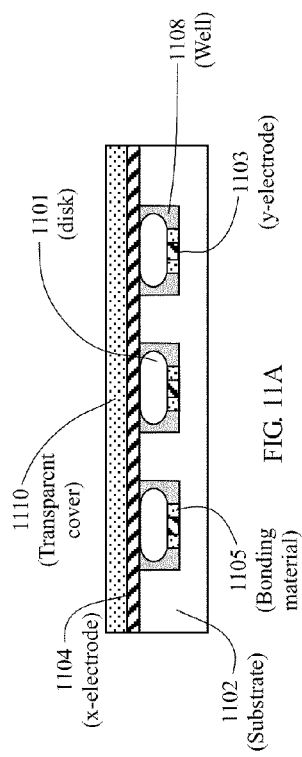
FIG. 11
FIG. 11A
FIG. 11B

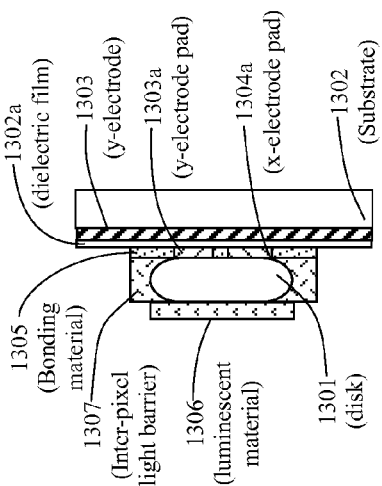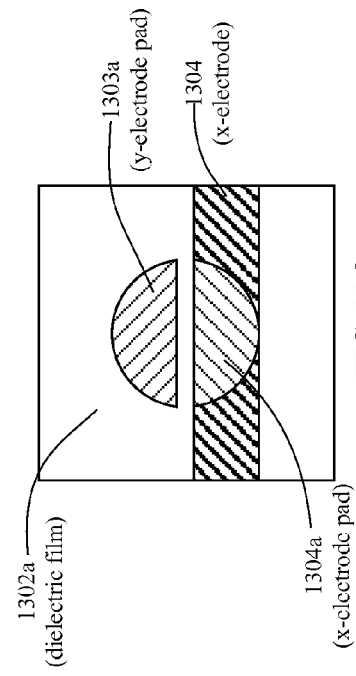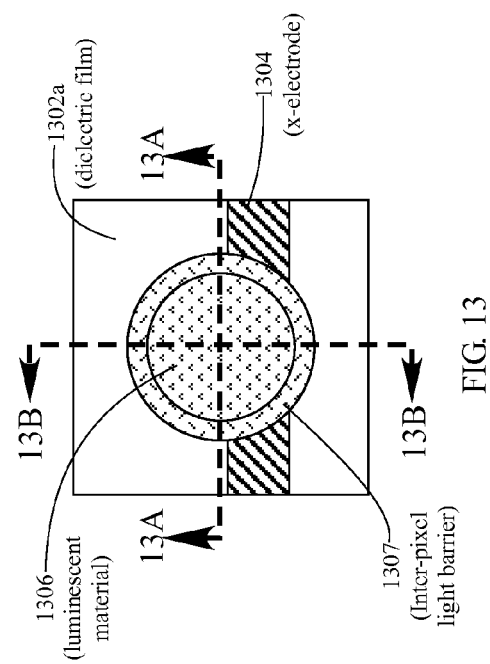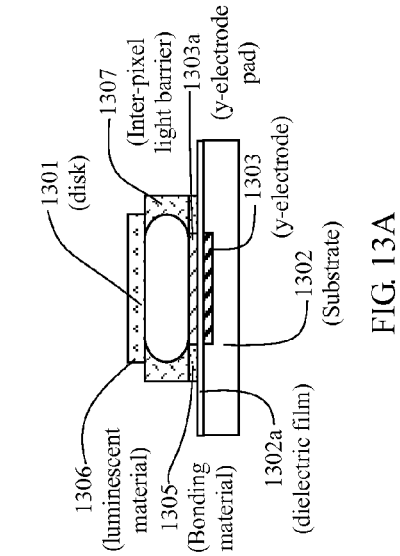
FIG. 13
FIG. 13A
FIG. 13B
FIG. 13C

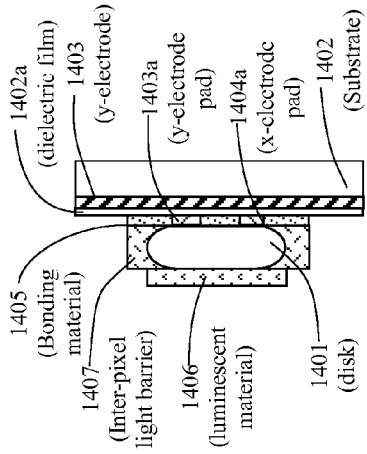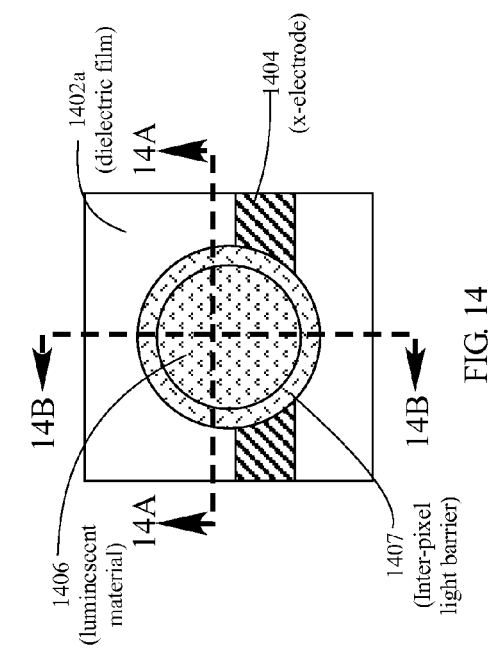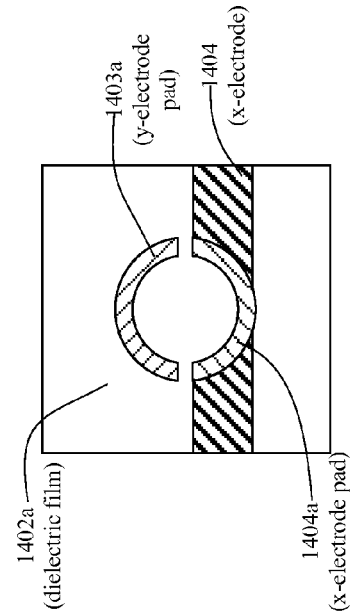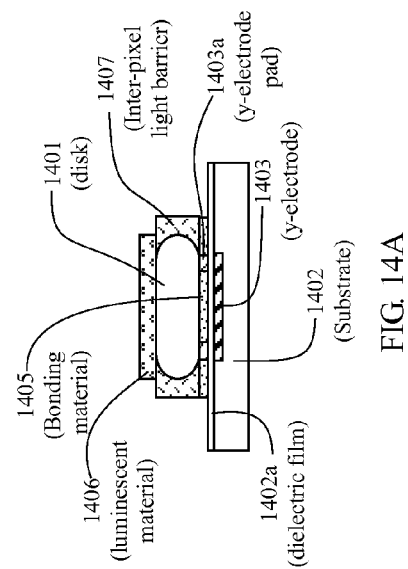
FIG. 14
FIG. 14A
FIG. 14B
FIG. 14C

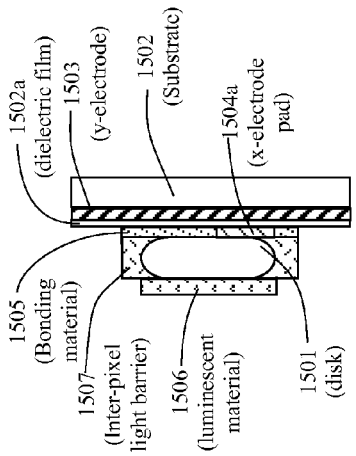
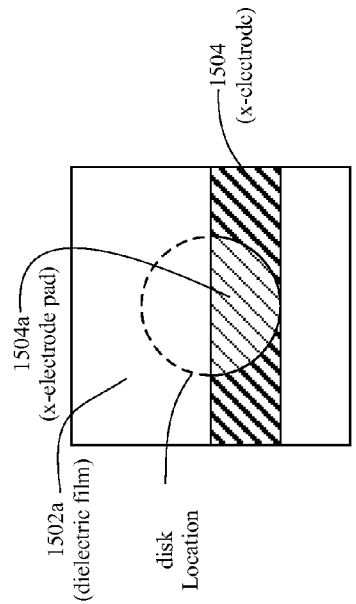
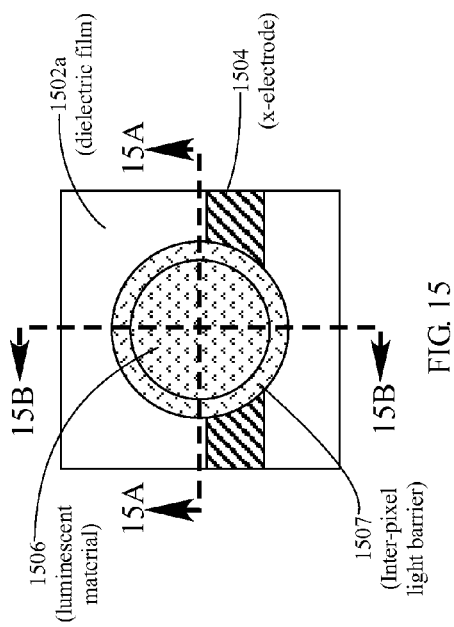
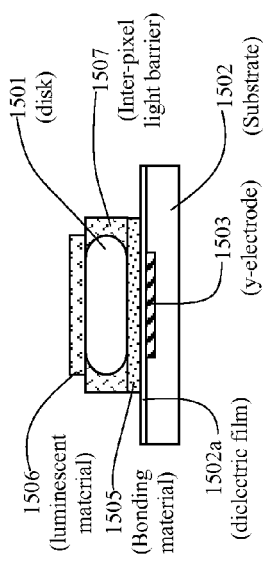
FIG. 15
FIG. 15B
FIG. 15C
FIG. 15A

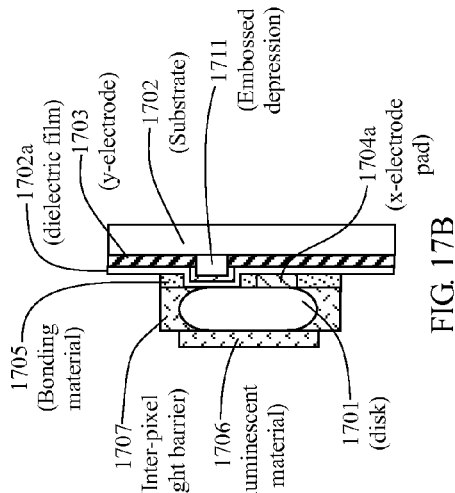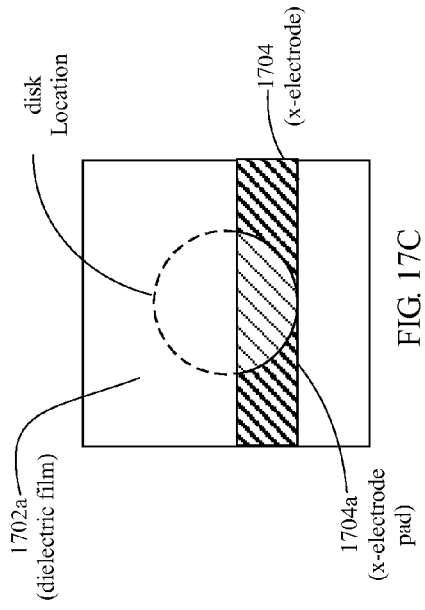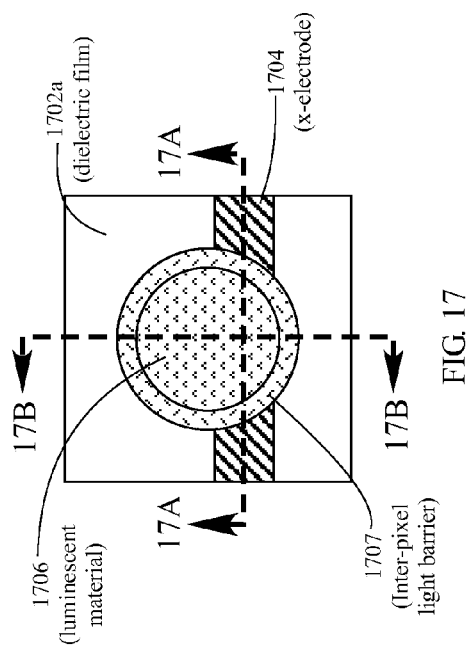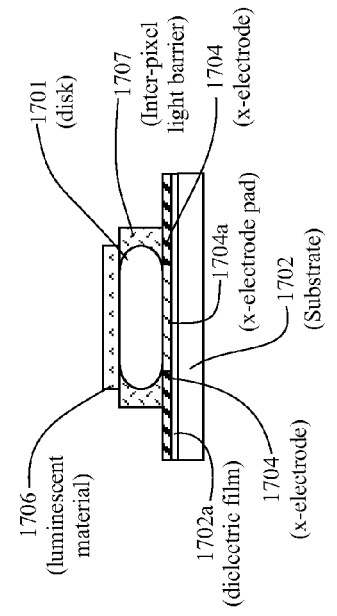

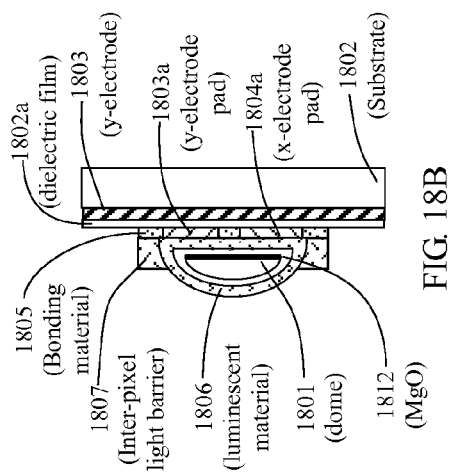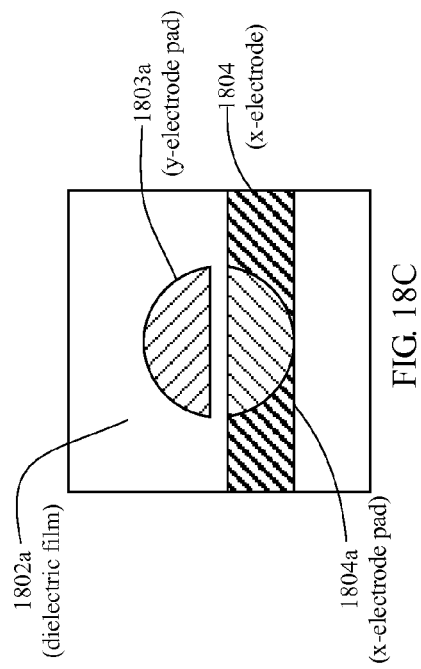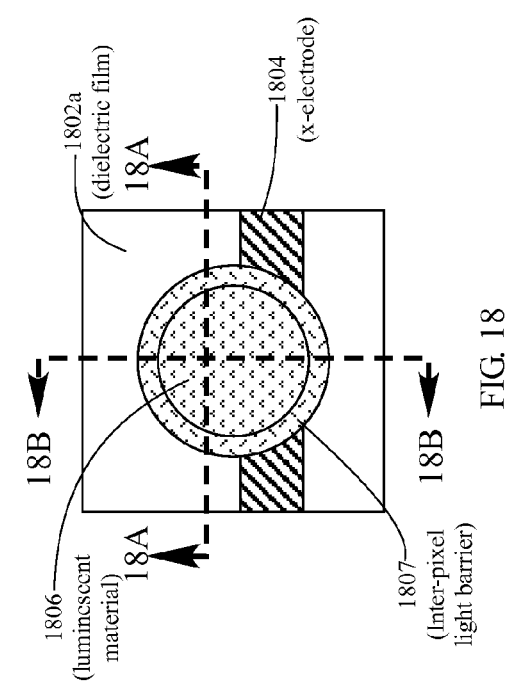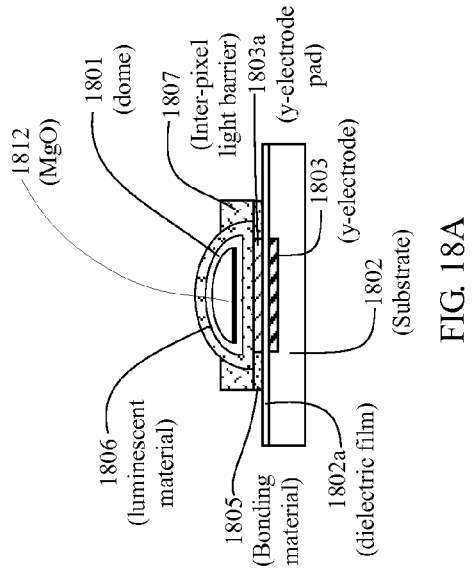

LUMINO-SHELLS

RELATED APPLICATION

This application claims priority under 35 U.S.C. 119(e) for Provisional Ser. No. 61/032,939 filed Feb. 29, 2008, and is also a continuation-in-part under 35 U.S.C. 120 of Utility patent application Ser. No. 12/172,646 filed Jul. 14, 2008 now U.S. Pat. No. 7,833,076 which is a division and continuation-in-part of Utility patent application Ser. No. 11/107,964, filed Apr. 18, 2005, now U.S. Pat. No. 7,405,516 which claims priority under 35 U.S.C. 119(e) for Provisional Patent Application Ser. No. 60/564,942, filed Apr. 26, 2004.

FIELD OF THE INVENTION

This invention relates to a display having one or more lumino-shells with a luminescent substance located in close proximity to each shell, the luminescent substance being excited by an electric current to produce light output. The display comprises one or more shells on or within a substrate with each shell being electrically connected to at least two electrical conductors such as electrodes.

As used herein, shell includes any suitable geometric shape including a disk shape, dome shape, and sphere shape. Combinations of different geometrically shaped shells may be used. The hollow shell contains a luminescent substance and is used as a pixel or subpixel in a display device such as an OLED. Shells may be used in combination with elongated tubes.

In accordance with this invention, there is provided a hollow lumino-shell containing a luminescent substance, the lumino-shell being electrically connected to two or more electrodes for energizing the luminescent substance and causing the luminescent substance to produce light in the visible and/or invisible range. The lumino-shell may contain one or more conductive pads for electrically connecting to the electrodes. Lumino-shell includes any geometric shape or body including lumino-sphere, lumino-dome, and lumino-disk. The lumino-shell may be partially or wholly made of a luminescent substance. In one embodiment, the lumino-shell is partially or wholly coated with the luminescent substance. In another embodiment, the hollow lumino-shell is partially filled or completely filled with a luminescent substance.

In one embodiment, there is utilized an organic electroluminescent phosphor material such as an OLED (organic light emitting diodes), which include polymeric OLEDs (PLEDs). OLED displays are current driven as opposed to other displays such as plasma displays which are voltage driven. The light output of an OLED pixel is approximately proportional to the current flowing through it. Therefore, to control the light output of an OLED pixel, the magnitude and duration of the current flowing through it is controlled. The luminescent material may include inorganic phosphor combined with the organic luminescent material.

BACKGROUND OF INVENTION

Electroluminescent

Electroluminescent (EL) display structures and devices are known in the prior art. Examples include U.S. Pat. Nos. 3,508,208 (Duguay et al.), 4,357,557 (Inohara et al.), 5,093,698 (Egusa), 5,895,932 (Bojarczuk, Jr. et al.), 5,898,185 (Bojarczuk, Jr. et al.), 6,140,766 (Okada et al.), 6,361,885 (Chou), 6,525,484 (Huiberts et al.), 6,583,583 (Soeda et al.), 6,614,057 (Silvernail et al.), 6,633,121 (Eida et al.), and 6,638,645 (Sawai et al.), all incorporated herein by reference.

Electronics

Electronics for driving the lumino-shells are known in the art. Examples include U.S. Pat. Nos. 6,492,776 (Rutherford), 6,661,029 (Duggal), 6,861,810 (Rutherford), and U.S. Patent Application Publication Nos. 2001/0054711 (Numao), 2002/0167474 (Everitt), 2002/0190661 (Duggal et al.), and 2004/0021425 (Foust et al.), all incorporated herein by reference.

Single Substrate

In one embodiment, there is used a structure having a so-called single substrate or monolithic display panel structure having one substrate with or without a top or front viewing envelope or dome. Single-substrate or monolithic plasma display panel structures are known in the prior art and are disclosed by U.S. Pat. Nos. 3,646,384 (Lay), 3,652,891 (Janning), 3,666,981 (Lay), 3,811,061 (Nakayama et al.), 3,860,846 (Mayer), 3,885,195 (Amano), 3,935,494 (Dick et al.), 3,964,050 (Mayer), 4,106,009 (Dick), 4,164,678 (Biazzo et al.), and 4,638,218 (Shinoda et al.), all incorporated herein by reference.

RELATED PRIOR ART

Spheres, Beads, Ampoules, Capsules

The construction of a plasma display panel (PDP) out of gas-filled hollow microspheres is known in the prior art. Such microspheres are referred to as spheres, beads, ampoules, capsules, bubbles, shells, and so forth.

U.S. Pat. No. 2,644,113 (Etzkorn) discloses ampoules or hollow glass beads containing luminescent gases that emit a colored light. In one embodiment, the ampoules are used to radiate ultra violet light onto a phosphor external to the ampoule itself. U.S. Pat. No. 3,848,248 (MacIntyre) discloses the embedding of gas-filled beads in a transparent dielectric. The beads are filled with a gas using a capillary. The external shell of the beads may contain phosphor. U.S. Pat. No. 3,998,618 (Kreick et al.) discloses the manufacture of gas-filled beads by the cutting of tubing. The tubing is cut into ampoules and heated to form shells.

U.S. Pat. No. 4,035,690 (Roeber) discloses a plasma panel display with a plasma forming gas encapsulated in clear glass shells. Roeber used commercially available glass shells containing gases such as air, $SO_2$ or $CO_2$ at pressures of 0.2 to 0.3 atmosphere. U.S. Pat. No. 4,963,792 (Parker) discloses a gas discharge chamber including a transparent dome portion. U.S. Pat. No. 5,326,298 (Hotomi) discloses a light emitter for giving plasma light emission. The light emitter comprises a resin including fine bubbles in which a gas is trapped. The gas is selected from rare gases, hydrocarbons, and nitrogen.

U.S. Pat. No. 6,545,422 (George et al.) discloses a light-emitting panel with a plurality of sockets with spherical or other shape micro-components in each socket sandwiched between two substrates. The micro-component includes a shell filled with a plasma-forming gas or other material. The light-emitting panel may be a plasma display, electroluminescent display, or other display device. Such is also disclosed in U.S. Pat. Nos. 6,570,335 (George et al.), 6,612,889 (Green et al.), 6,620,012 (Johnson et al.), 6,646,388 (George et al.), 6,762,566 (George et al.), 6,764,367 (Green et al.), 6,791,264 (Green et al.), 6,796,867 (George et al.), 6,801,001 (Drobot et al.), 6,822,626 (George et al.), U.S. Patent Application Publication Nos. 2003/0164684 (Green et al.), 2003/

0207643 (Wyeth et al.), 2004/0051450 (George et al.), 2004/0063373 (Johnson et al.), 2004/0106349 (Green et al.), and 2004/0166762 (Green et al.).

RELATED PRIOR ART

Methods of Producing Microspheres

Methods and processes to produce hollow shells or microspheres are known in the prior art. Microspheres have been formed from glass, ceramic, metal, plastic, and other inorganic and organic materials. Varying methods and processes for producing shells and microspheres have been disclosed and practiced.

Some methods used to produce hollow glass microspheres incorporate a blowing gas into the lattice of a glass while in frit form. The frit is heated and glass bubbles are formed by the in-permeation of the blowing gas. Methods of manufacturing glass frit for forming hollow microspheres are disclosed by U.S. Pat. Nos. 4,017,290 (Budrick et al.) and 4,021,253 (Budrick et al.). Budrick et al. '290 discloses a process whereby occluded material gasifies to form the hollow microsphere. Hollow microspheres are disclosed in U.S. Pat. Nos. 5,500,287 (Henderson) and 5,501,871 (Henderson). The hollow microspheres are formed by dissolving a permeant gas (or gases) into glass frit particles. The gas permeated frit particles are then heated at a high temperature sufficient to blow the frit particles into hollow microspheres containing the permeant gases. U.S. Pat. Nos. 4,257,798 (Hendricks et al.), 4,186,637 (Hendricks), and 4,133,854 (Hendricks) disclose a method for manufacturing small hollow glass spheres.

The production of microspheres is disclosed in U.S. Pat. No. 4,415,512 (Torobin). This Torobin method comprises forming a film of molten glass across a blowing nozzle and applying a blowing gas at a positive pressure on the inner surface of the film to blow the film and form an elongated cylinder shaped liquid film of molten glass. An inert entraining fluid is directed over and around the blowing nozzle at an angle to the axis of the blowing nozzle so that the entraining fluid dynamically induces a pulsating or fluctuating pressure at the opposite side of the blowing nozzle in the wake of the blowing nozzle. The continued movement of the entraining fluid produces asymmetric fluid drag forces on a molten glass cylinder which close and detach the elongated cylinder from the coaxial blowing nozzle. Surface tension forces acting on the detached cylinder form the latter into a spherical shape which is rapidly cooled and solidified by cooling means to form a glass microsphere.

In one embodiment of the Torobin method, the ambient pressure external to the blowing nozzle is maintained at a super atmospheric pressure. The ambient pressure external to the blowing nozzle is such that it substantially balances, but is slightly less than the blowing gas pressure. Such a method is disclosed by U.S. Pat. No. 4,303,432 (Torobin) and WO 8000438A1 (Torobin). The microspheres may also be produced using a centrifuge apparatus and method as disclosed by U.S. Pat. No. 4,303,433 (Torobin) and WO8000695A1 (Torobin).

Other methods for forming microspheres of glass, ceramic, metal, plastic, and other materials are disclosed in other Torobin patents including U.S. Pat. Nos. 5,397,759; 5,225,123; 5,212,143; 4,793,980; 4,777,154; 4,743,545; 4,671,909; 4,637,990; 4,582,534; 4,568,389; 4,548,196; 4,525,314; 4,363,646; 4,303,736; 4,303,732; 4,303,731; 4,303,603; 4,303,431; 4,303,730; 4,303,729 and 4,303,061.

U.S. Pat. No. 3,607,169 (Coxe) discloses an extrusion method in which a gas is blown into molten glass and individual shells are formed. U.S. Pat. No. 4,349,456 (Sowman) discloses a process for making ceramic metal oxide microspheres by blowing a slurry of ceramic and highly volatile organic fluid through a coaxial nozzle. As the liquid dehydrates, gelled microcapsules are formed. These microcapsules are recovered by filtration, dried, and fired to convert them into microspheres.

U.S. Patent Application Publication 2002/0004111 (Matsubara et al.) discloses a method of preparing hollow glass microspheres by adding a combustible liquid (kerosene) to a material containing a foaming agent. Methods for forming microspheres are also disclosed in U.S. Pat. Nos. 3,848,248 (MacIntyre), 3,998,618 (Kreick et al.), and 4,035,690 (Roeber) discussed above. Methods of manufacturing hollow microspheres are disclosed in U.S. Pat. Nos. 3,794,503 (Netting), 3,796,777 (Netting), 3,888,957 (Netting), and 4,340,642 (Netting et al.). Other prior art methods for forming microspheres are disclosed in the prior art including U.S. Pat. Nos. 3,528,809 (Farnand et al.), 3,975,194 (Farnand et al.), 4,025,689 (Kobayashi et al.), 4,211,738 (Genis), 4,307,051 (Sargeant et al.), 4,569,821 (Duperray et al.) 4,775,598 (Jaeckel), and 4,917,857 (Jaeckel et al.).

Farnand et al. ('809) discloses the production of hollow metal spheres by coating a core material such as naphthalene or anthracene with metal flakes such as aluminum or magnesium. The organic core is sublimed at room temperature over 24 to 48 hours. The aluminum or magnesium is then heated to an elevated temperature in oxygen to form aluminum or magnesium oxide.

Farnand ('194) discloses a similar process comprising polymers dissolved in naphthalene including polyethylene and polystyrene. The core is sublimed or evaporated to form hollow spheres or microballoons. Kobayashi et al. ('689) discloses the coating of a core with carbon powder. The core is heated and decomposed and the carbon powder heated in argon at 3000° C. to obtain hollow porous graphitized spheres. Genis ('738) discloses the making of lightweight aggregate using a nucleus of expanded polystyrene pellet with outer layers of sand and cement. Sargeant et al. ('051) discloses the making of light weight-refractories by wet spraying core particles of polystyrene with an aqueous refractory coating such as clay with alumina, magnesia, and/or other oxides. The core particles are subject to a tumbling action during the wet spraying and fired at 1730° C. to form porous refractory. Duperray et al. ('821) discloses the making of a porous metal body by suspending metal powder in an organic foam which is heated to pyrolyze the organic and sinter the metal. Jaeckel ('598) and Jaeckel et al. ('857) disclose the coating of a polymer core particle such as foamed polystyrene with metals or inorganic materials followed by pyrolysis on the polymer and sintering of the inorganic materials to form the sphere. Both disclose the making of metal spheres such as copper or nickel spheres which may be coated with an oxide such as aluminum oxide. Jaeckel et al. ('857) further discloses a fluid bed process to coat the core.

SUMMARY OF INVENTION

This invention relates to a display device comprising one or more lumino-shells containing an organic luminescent substance, the luminescent substance being excited by electric current to cause light output. The display device comprises one or more shells on or within a substrate with each shell being electrically connected to at least two electrical conductors such as electrodes. Insulating barriers may be used to prevent contact between the electrodes. Each display lumino-shell is of any suitable geometric shape such as a lumino-sphere, lumino-disk, or lumino-dome suitable for use in a display device. Combinations of lumino-shells of different geometric shapes may be used in the display device. Lumino-shells may also be used in combination with elongated tubes. This invention is illustrated herein with respect to lumino-disks and including lumino-disks in combination with other lumino-shells.

A lumino-sphere is a primarily hollow sphere with relatively uniform shell thickness. The shell contains a luminescent substance selected to produce light in the visible and/or invisible range when a current is applied. The shell material is selected to optimize dielectric properties and optical transmissivity. Additional materials may be added to the sphere. Organic and/or inorganic luminescent substances may also be added directly to the shell material.

A lumino-disk is similar to the sphere in material composition. It differs from the sphere in that it is flattened on both the top and bottom. A sphere may be flattened to form a disk by applying heat and pressure simultaneously to the top and bottom of the sphere using two substantially flat and ridged members, either of which may be heated. Each of the other four sides may be flat or round.

A lumino-dome is similar to a sphere in material composition and ionizable gas selection. It differs in that one side is domed. A sphere is flattened on one or more other sides to form a dome, typically by applying heat and pressure simultaneously to the top and bottom of the sphere using one substantially flat and ridged member and one substantially elastic member. In one embodiment, the substantially rigid member is heated.

BRIEF DESCRIPTION OF THE DRAWINGS

FIG. 4 is a top view of a lumino-disk mounted on a substrate with two x-electrodes and one y-electrode.
FIG. 4A is a Section View 4A-4A of FIG. 4.
FIG. 4B is a Section View of 4B-4B of FIG. 4.
FIG. 4C is a top view of the substrate and electrodes in FIG. 4 with the disk locations shown in broken lines.
FIG. 5 is a top view of a lumino-disk mounted on a substrate with two x-electrodes and one y-electrode.
FIG. 5A is a Section View 5A-5A of FIG. 5.
FIG. 5B is a Section View of 5B-5B of FIG. 5.
FIG. 5C is a top view of the substrate and electrodes in FIG. 5 with the disk locations shown in broken lines.

FIG. 7 is a top view of a lumino-disk mounted on a substrate with one x-electrode and one y-electrode.
FIG. 7A is a Section View 7A-7A of FIG. 7.
FIG. 7B is a Section View of 7B-7B of FIG. 7.
FIG. 7C is a top view of the substrate and electrodes in FIG. 7 with the disk location shown in broken lines.
FIG. 8 is a top view of a lumino-disk mounted on a substrate with one x-electrode and one y-electrode.
FIG. 8A is a Section View 8A-8A of FIG. 8.
FIG. 8B is a Section View of 8B-8B of FIG. 8.
FIG. 8C is a top view of the substrate and electrodes in FIG. 8 with the disk location shown in broken lines.
FIG. 9 is a top view of a lumino-disk mounted on a substrate with one x-electrode and one y-electrode.
FIG. 9A is a Section View 9A-9A of FIG. 9.
FIG. 9B is a Section View of 9B-9B of FIG. 9.
FIG. 9C is a top view of the substrate and electrodes in FIG. 9 without the disk.
FIG. 10 is a top view of a substrate with multiple x-electrodes, multiple y-electrodes, and trenches or grooves for receiving lumino-disks.
FIG. 10A is a Section View 10A-10A of FIG. 10.
FIG. 10B is a Section View of 10B-10B of FIG. 10.
FIG. 11 is a top view of a substrate with multiple x-electrodes, multiple y-electrodes, and multiple wells or cavities for receiving lumino-disks.
FIG. 11A is a Section View 11A-11A of FIG. 11.
FIG. 11B is a Section View of 11B-11B of FIG. 11.
FIG. 13 is a top view of a lumino-disk mounted on a substrate with one x-electrode and one y-electrode.
FIG. 13A is a Section View 13A-13A of FIG. 13.
FIG. 13B is a Section View of 13B-13B of FIG. 13.
FIG. 13C is a top view of the substrate and electrodes in FIG. 13 without the disk.
FIG. 14 is a top view of a lumino-disk mounted on a substrate with one x-electrode and one y-electrode.
FIG. 14A is a Section View 14A-14A of FIG. 14.
FIG. 14B is a Section View of 14B-14B of FIG. 14.
FIG. 14C is a top view of the substrate and electrodes in FIG. 14 without the disk.
FIG. 15 is a top view of a lumino-disk mounted on a substrate with one x-electrode and one y-electrode.
FIG. 15A is a Section View 15A-15A of FIG. 15.
FIG. 15B is a Section View of 15B-15B of FIG. 15.
FIG. 15C is a top view of the substrate and electrodes in FIG. 15 with the disk location shown in broken lines.
FIG. 17 is a top view of a lumino-disk mounted on a substrate with one x-electrode and one y-electrode.
FIG. 17A is a Section View 17A-17A of FIG. 17.

FIG. 17B is a Section View of 17B-17B of FIG. 17.

FIG. 17C is a top view of the substrate and electrodes in FIG. 17 with the disk location shown in broken lines.

FIG. 18 is a top view of a lumino-dome mounted on a substrate with two x-electrodes and one y-electrode.

FIG. 18A is a Section View 18A-18A of FIG. 18.

FIG. 18B is a Section View of 18B-18B of FIG. 18.

FIG. 18C is a top view of the substrate and electrodes.

DETAILED DESCRIPTION OF DRAWINGS AND EMBODIMENTS OF INVENTION

In accordance with this invention, there is provided a display method and apparatus utilizing one or more lumino-shells arranged in an array or in other suitable configuration with a luminescent each lumino-shell containing a substance. As illustrated herein, at least two conductors are electrically connected to a lumino-shell located within or on a rigid, flexible, or semi-flexible substrate or other body, by means of an electrically conductive or insulating dielectric bonding substance applied to the substrate or to each lumino-shell. In one embodiment, each electrical connection to each lumino-shell is separated from each other electrical conductive bonding substance connection on the lumino-shell by an insulating barrier so as to prevent the conductive substance forming one electrical connection from flowing and electrically shorting out another electrical connection.

The lumino-shell may be of any suitable geometric shape including a lumino-sphere, lumino-dome, or lumino-disk. In one embodiment of this invention, there is provided a display device comprised of one or more lumino-disks alone or in combination with one or more other lumino-shells of other geometric shapes. The practice of this invention is illustrated and described hereafter with respect to lumino-disks. However, other lumino-shell shapes are contemplated and may be used. The lumino-shell may be used in combination with one or more elongated tubes. The luminescent material is positioned internally and/or externally within each lumino-shell. The luminescent material is organic. Inorganic luminescent material may be incorporated with or used in various combinations with the organic luminescent material, or vice versa.

DETAILED DESCRIPTION OF THE DRAWINGS

Figure 1:
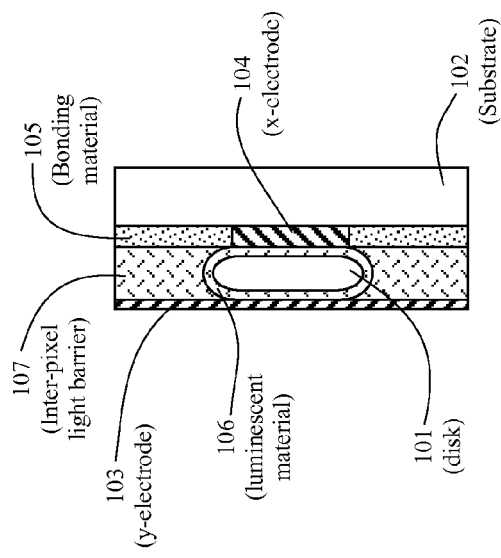
FIG. 1 is a top view of a display shell in the geometric shape of a lumino-disk mounted on a substrate with x-electrode and y-electrode.

FIG. 1 shows substrate 102 with transparent y-electrode 103, luminescent material 106, x-electrode 104, and inter-pixel light barrier 107. The y-electrode 103 and x electrode 104 are cross-hatched for identification purposes. The y-electrode 103 is transparent because it is shown as covering much of the lumino-disk 101 not shown in FIG. 1.

Figure 1B:
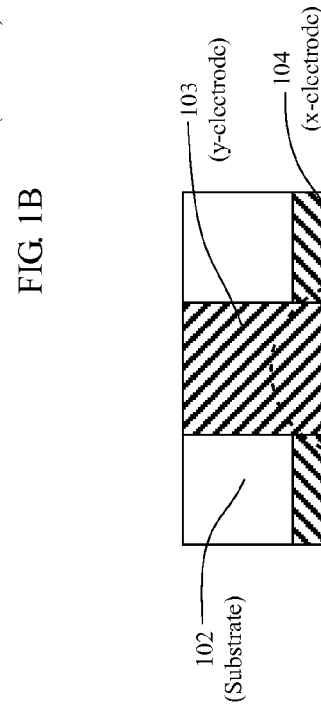
FIG. 1B is a Section View 1B-1B of FIG. 1.
Figure 1A:
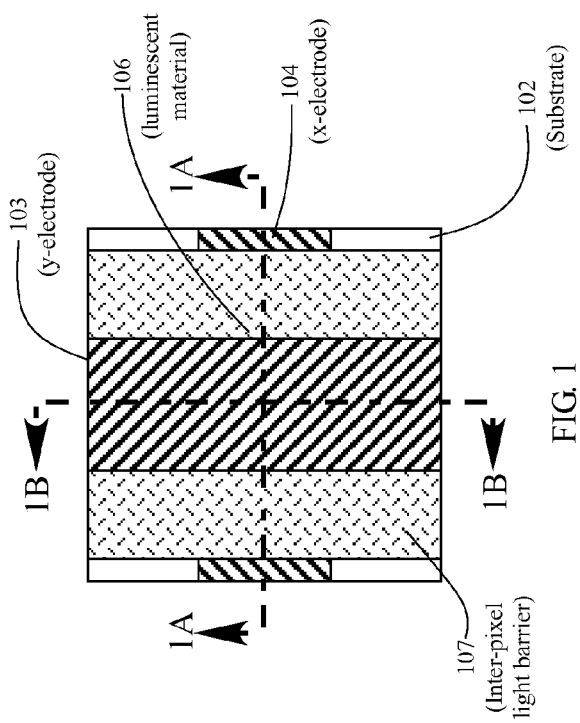
FIG. 1A is a Section View 1A-1A of FIG. 1.

FIG. 1A is a Section View 1A-1A of FIG. 1 and FIG. 1B is a Section View 1B-1B of FIG. 1, each Section View showing the lumino-disk 101 mounted on the surface of substrate 102 with top y-electrode 103 and bottom x-electrode 104, and inter-pixel light barrier 107. The lumino-disk 101 is attached to the substrate 102 with bonding material 105. Luminescent material 106 is located on the top surface of lumino-disk 101.

In one embodiment, the lumino-disk 101 is partially or completely coated with the luminescent material 106.

As illustrated in FIGS. 1A and 1B lumino-disk 101 is sandwiched between an y-electrode 103 and x-electrode 104. Inner pixel light barrier 107 is of substantially the same thickness or height as lumino-disk 101. The light barrier may extend and bridge between adjacent pixels. This allows the transparent y-electrode 103 to be applied to a substantially flat surface. The light barrier 107 is made of an opaque or non-transparent material to prevent optical cross-talk between adjacent lumino-disks.

The lumino-disk 101 is attached to the substrate 102 with bonding material 105. As practiced in this invention, bonding material is applied to the entire substrate 102 before the lumino-disk 101 is attached. Bonding material 105 may coat some or all of the x-electrode. Bonding material provides a dielectric interface between the electrode and the lumino-disk 101.

The bonding material 105 can be of any suitable adhesive substance. In one embodiment hereof, there is used a Z-Axis electrically conductive tape such as manufactured by 3M.

Figure 1C:
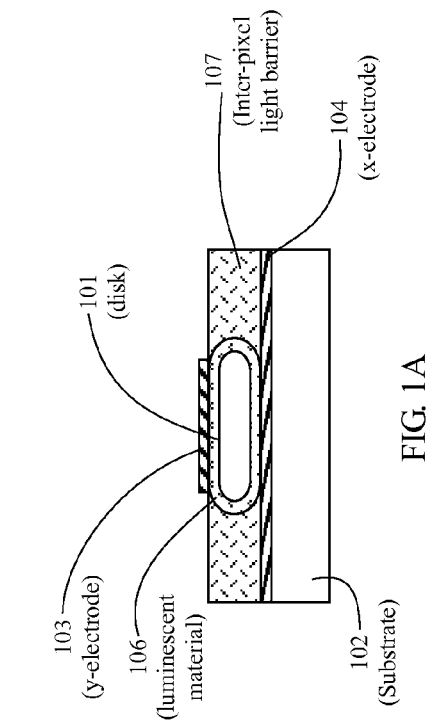
FIG. 1C is a top view of the FIG. 1 substrate showing the x-electrode and y-electrode configuration with the disk location shown with broken lines.

FIG. 1C shows the electrodes 103 and 104 on the substrate 102 with the location of the lumino-disk 101 (not shown) indicated with broken lines.

Figure 2:
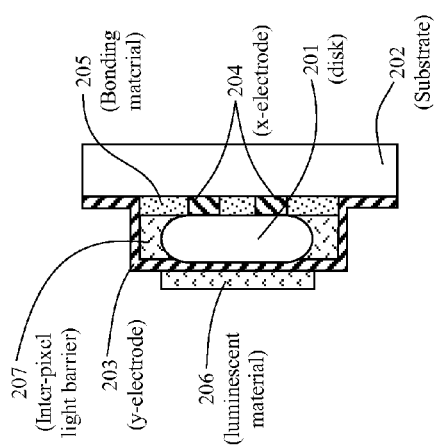
FIG. 2 is a top view of a lumino-disk mounted on a substrate with x-electrode and y-electrode.

FIG. 2 shows substrate 202 with y-electrode 203, luminescent material 206, x-electrode 204, and inter-pixel light barrier 207. The y-electrode 203 and x-electrode 204 are cross-hatched for identification purposes. The y-electrode 203 may be transparent or not depending upon its width and obscurity of the lumino-disk 201 not shown in FIG. 2. In this embodiment, the inter-pixel light bather 207 does not extend and form a bridge between adjacent pixels.

Figure 2C:
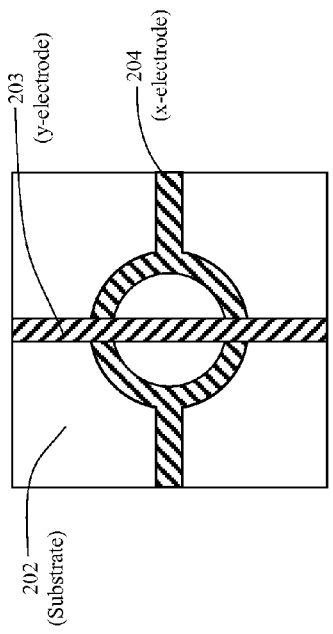
FIG. 2C is a top view of the FIG. 2 substrate showing the x-electrode and y-electrode configuration without the disk.
Figure 2A:
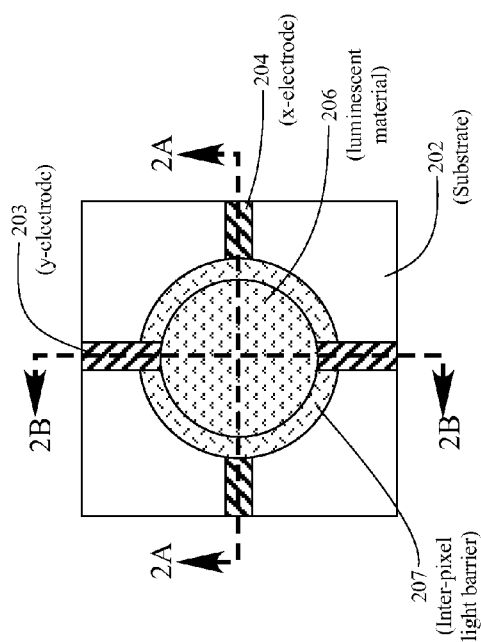
FIG. 2A is a Section View 2A-2A of FIG. 2
Figure 2B:
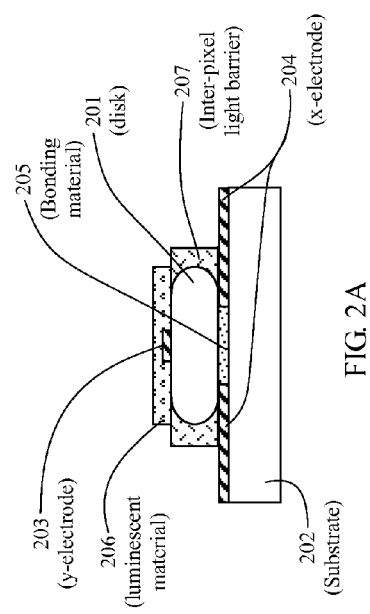
FIG. 2B is a Section View 2B-2B of FIG. 2.

FIG. 2A is a Section View 2A-2A of FIG. 2 and FIG. 2B is a Section View 2B-2B of FIG. 2, each Section View showing the lumino-disk 201 mounted on the surface of substrate 202 with top y-electrode 203 and bottom x-electrode 204, and inter-pixel light bather 207. The lumino-disk 201 is attached to the substrate 202 with bonding material 205. The luminescent material 206 is located on the top surface of the lumino-disk 201.

FIG. 2C shows the y-electrode 203 and x-electrode 204 on the substrate 202, the x-electrode 204 being in a donut configuration where the lumino-disk 201 (not shown) is to be positioned.

In this FIG. 2 embodiment the discharge between the x and y electrodes will first occur at the intersection of electrodes 203 and 204 and spread around the donut shape of 204. Other electrode configurations are contemplated.

Figure 3:
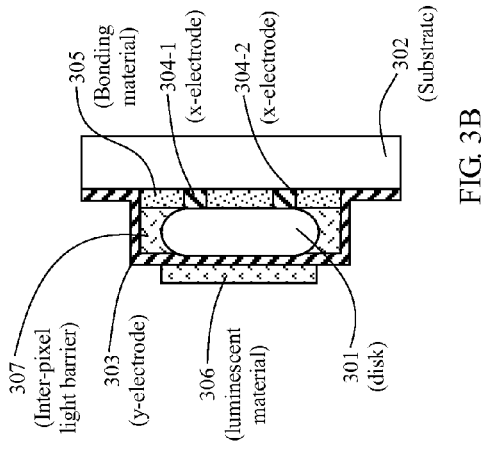
FIG. 3 is a top view of a lumino-disk mounted on a substrate with two x-electrodes and one y-electrode.

FIGS. 3, 3A, 3B, and 3C are several views of a three-electrode configuration and embodiment employing positive column discharge. FIG. 3 shows substrate 302 with top y-electrode 303, dual bottom x-electrodes 304-1, 304-2, luminescent material 306, and inter-pixel light barrier 307. The y-electrode 303 and x-electrodes 304-1, 304-2 are cross-hatched for identification purposes.

Figure 3B:
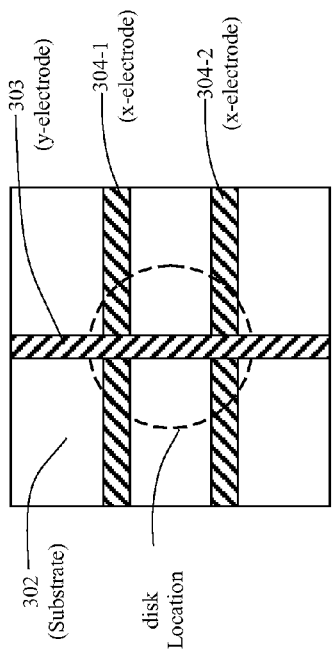
FIG. 3B is a Section View 3B-3B of FIG. 3.
Figure 3A:
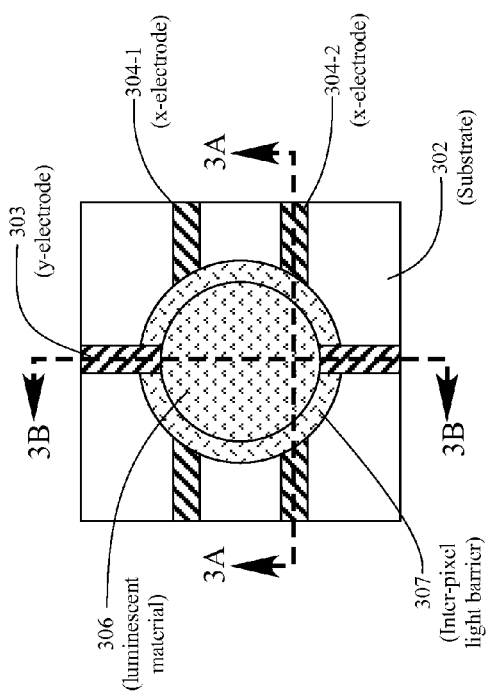
FIG. 3A is a Section View of 3A-3A of FIG. 3.

FIG. 3A is a Section View 3A-3A of FIG. 3 and FIG. 3B is a Section View 3B-3B of FIG. 3, each Section View showing the lumino-disk 301 mounted on the surface of the substrate 302 with top y-electrode 303 and dual bottom x-electrodes 304-1 and 304-2, inter-pixel light bather material 307, and luminescent material 306. The lumino-disk 301 is attached to the substrate 302 with bonding material 305. The luminescent material 306 is on top of the lumino-disk 301.

Figure 3C:
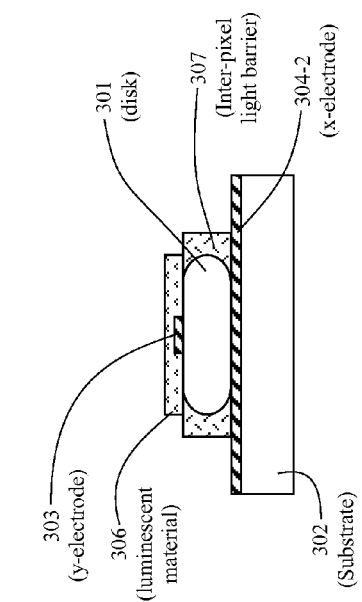
FIG. 3C is a top view of the FIG. 3 substrate showing the x-electrodes and y-electrode configuration with the disk location shown with broken lines.

FIG. 3C shows the electrodes 303, 304-1, and 304-2 on the substrate 302 with the location of the lumino-disk 301 (not shown) indicated with broken lines.

This embodiment is similar to the FIG. 2 embodiment except that the donut shaped x-electrode is replaced with two independent x-electrodes 304-1 and 304-2. After a discharge is initiated at the intersection of electrode 303 and 304-1 or 304-2, it is maintained by a longer positive column discharge between 304-1 and 304-2.

FIGS. 4, 4A, 4B, and 4C are several views of a three-electrode configuration and embodiment in which the lumino-disk 401 is embedded in a trench or groove 408.

FIG. 4 shows substrate 402 with top y-electrode 403, dual bottom x-electrodes 404-1, 404-2, luminescent material 406, inter-pixel light barrier 407 and trench or groove 408. The y-electrode 403 and x-electrodes 404-1, 404-2 are cross-hatched for identification purposes.

FIG. 4A is a Section View 4A-4A of FIG. 4 and FIG. 4B is a Section View 4B-4B of FIG. 4, each Section View showing the lumino-disk 401 mounted in the trench or groove 408 on the surface of the substrate 402 with top y-electrode 403 and dual bottom x-electrodes 404-1 and 404-2, inter-pixel light bather material 407, and luminescent material 406. The lumino-disk 401 is within the trench or groove 408 and attached to the substrate 402 with bonding material 405.

FIG. 4C shows the electrodes 403, 404-1, and 404-2 on the substrate 402 with the location of the lumino-disk 401 (not shown) indicated with broken lines.

This FIG. 4 embodiment is a three electrode structure with similar characteristics to the FIG. 3 embodiment. However x-electrodes 404-1 and 404-2 extend down the middle of trench 408 formed in substrate 402. The lumino-disk 401 is attached with bonding material to the inside of the trench. Optional light barrier material 407 may be applied around the lumino-disk. Y-electrode 403 is applied across the top of the substrate and optional luminescent material 406 may be applied over the top of the lumino-disk. FIG. 4C shows optional locating notch 409 to help position the lumino-disk.

FIGS. 5, 5A, 5B, and 5C are several views of a three-electrode configuration and embodiment in which the lumino-disk 501 is embedded in a trench or groove 508. FIG. 5 shows transparent substrate 502 with top y-electrode 503, dual bottom x-electrodes 504-1, 504-2, luminescent material 506, inter-pixel light barrier 507, and trench or groove 508. The y-electrode 503 and x-electrodes 504-1, 504-2 are cross-hatched for identification purposes.

FIG. 5A is a Section View 5A-5A of FIG. 5 and FIG. 5B is a Section View 5B-5B of FIG. 5, each Section View showing the lumino-disk 501 mounted in the trench or groove 508 on the surface of the substrate 502 with top y-electrode 503 and dual bottom x-electrodes 504-1 and 504-2, inter-pixel light barrier 507, and luminescent material 506. The lumino-disk 501 is bonded within the trench or groove 508 and attached to the substrate 502 with bonding material 505. As shown in FIG. 5B, the luminescent material 506 covers the surface of the lumino-disk 501.

FIG. 5C shows the electrodes 503, 504-1, and 504-2 on the substrate 502 with the location of the lumino-disk 501 (not shown) indicated with broken lines. A locating notch 509 is shown.

FIGS. 6, 6A, 6B, and 6C are several views of a three-electrode configuration and embodiment in which the lumino-disk 601 is contained within a trench or groove 608.

Figure 6B:
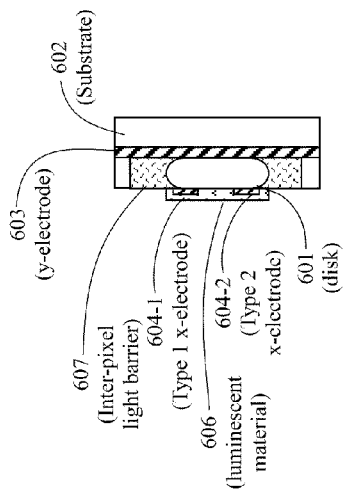
FIG. 6B is a Section View of 6B-6B of FIG. 6.
Figure 6C:
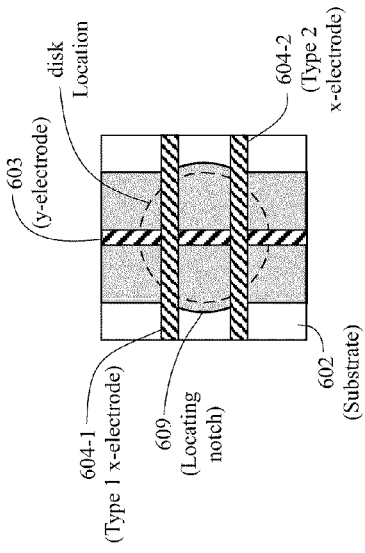
FIG. 6C is a top view of the substrate and electrodes in FIG. 6 with the disk location shown in broken lines.
Figure 6:
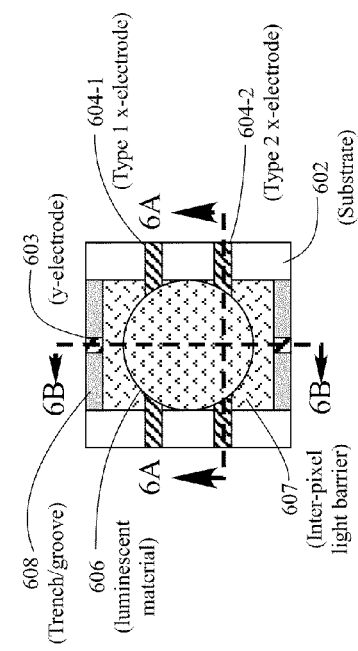
FIG. 6 is a top view of a lumino-disk mounted on a substrate with two x-electrodes and one y-electrode.

FIG. 6 shows substrate 602 with dual top x-electrodes 604-1, 604-2, bottom y-electrode 603, luminescent material 606, inter-pixel light barrier 607, and trench or groove 608. The x-electrodes 604-1, 604-2 and bottom y-electrodes 603 are cross-hatched for identification purposes.

Figure 6A:
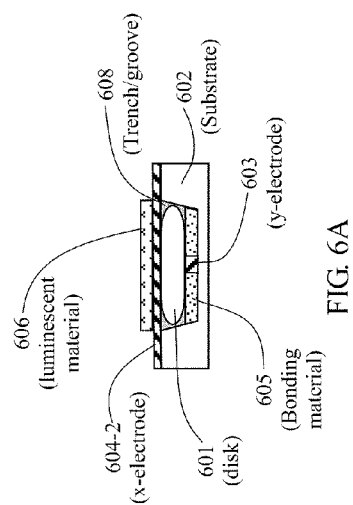
FIG. 6A is a Section View 6A-6A of FIG. 6.

FIG. 6A is a Section View 6A-6A of FIG. 6 and FIG. 6B is a Section View 6B-6B of FIG. 6, each Section View showing the lumino-disk 601 mounted within trench or groove 608 on the surface of the substrate 602 with bottom y-electrode 603 and dual top x-electrodes 604-1 and 604-2, inter-pixel light barrier 607, and luminescent material 606. The lumino-disk 601 is within the trench or groove 608 and attached to the substrate 602 with bonding material 605.

FIG. 6C shows the electrodes 603, 604-1, and 604-2 on the substrate 602 with the location of the lumino-disk 601 (not shown) indicated with broken lines. A lumino-disk locating notch 609 is shown.

The FIG. 6 embodiment differs from the FIG. 4 embodiment in that a single y-electrode 603 extends through the parallel center of the trench 608 and x-electrodes 604-1 and 604-2 are perpendicular to trench 608 and run along the top surface.

FIGS. 7, 7A, 7B, and 7C are several views of a two-electrode embodiment with a two-electrode configuration and pattern that employs positive column discharge. FIG. 7 shows substrate 702 with top y-electrode 703, bottom x-electrodes 704, luminescent material 706, and inter-pixel light barrier 707. The y-electrode 703 and x-electrode 704 are cross-hatched for identification purposes.

FIG. 7A is a Section View 7A-7A of FIG. 7 and FIG. 7B is a Section View 7B-7B of FIG. 7, each Section View showing the lumino-disk 701 mounted on the surface of substrate 702 with top y-electrode 703 and bottom x-electrode 704, inter-pixel light barrier 707, and luminescent material 706. The lumino-disk 701 is attached to the substrate 702 with bonding material 705. There is also shown in FIG. 7B y-electrode pad 703a.

FIG. 7C shows the electrodes 703 and 704 on the substrate 702 with the location of the lumino-disk 701 (not shown) indicated with broken lines. There is also shown y-electrode pad 703a and x-electrode pad 704a for contact with lumino-disk 701.

As in FIG. 2, FIG. 7 shows a two-electrode configuration and embodiment which employs positive column discharge. The top y-electrode 703 is applied over the lumino-disk 701 and light barrier 707. Additionally, the electrode 703 runs under lumino-disk 701 and forms a 'T' shaped electrode 703a. In this configuration, the discharge is initiated at the closest point between the two electrodes 703a and 704a under the lumino-disk and spread to the wider gap electrode regions, including electrode 703 which runs over the top of the lumino-disk. It will be obvious to one skilled in the art that there are electrode shapes and configurations other than the 'T' shape that perform essentially the same function.

FIGS. 8, 8A, 8B, and 8C are several views of a two-electrode configuration and embodiment in which neither the x nor the y electrode runs over the lumino-disk 801. FIG. 8 shows substrate 802 with x-electrode 804, luminescent material 806, and inter-pixel light barrier 807. The x-electrode 804 is cross-hatched for identification purposes.

FIG. 8A is a Section View 8A-8A of FIG. 8 and FIG. 8B is a Section View 8B-8B of FIG. 8, each Section View showing the lumino-disk 801 mounted on the surface of substrate 802 with bottom y-electrode 803, top x-electrode pad 804a, inter-pixel light barrier 807, and a top layer of luminescent material 806. The lumino-disk 801 is attached to the substrate 802 with bonding material 805. Also shown is y-electrode pad 803a and y-electrode via 803b forming a connection to y-electrode 803. The pads 803a and 804a are in contact with the lumino-disk 801.

FIG. 8C shows x-electrode 804 with pad 804a and y-electrode pad 803a with y-electrode via 803b on the substrate 802 with the location of the lumino-disk 801 indicated with broken lines.

In this configuration x-electrode 804 extends along the surface of substrate 802 and y-electrode 803 extends along an inner layer of substrate 802. The y-electrode 803 is perpendicular to x-electrode 804. Contact with lumino-disk 801 is made with 'T' shaped surface pads 804a and 803a. The 'T' shaped pad is beneficial to promote positive column discharge. Pad 803a is connected to electrode 803 by via 803b. Although y-electrode 803 is shown internal to substrate 802, it may also extend along the exterior surface of 802, opposite to the side that the lumino-disk is located.

FIGS. 9, 9A, 9B, and 9C are several views of an alternative two-electrode configuration and embodiment in which neither x- nor y-electrode extends over the lumino-disk 901.

FIG. 9 shows substrate 902 with x-electrode 904, luminescent material 906, and inter-pixel light barrier 907. The x-electrode 904 is cross-hatched for identification purposes.

FIG. 9A is a Section View 9A-9A of FIG. 9 and FIG. 9B is a Section View 9B-9B of FIG. 9, each Section View showing the lumino-disk 901 mounted on the surface of substrate 902 with bottom y-electrode 903 and bottom x-electrode pad 904a, inter-pixel light bather 907, and luminescent material 906. The lumino-disk 901 is attached to the substrate 902 with bonding material 905. Also shown is y-electrode pad 903a and y-electrode via 903b connected to y-electrode 903. Also shown is x-electrode pad 904a. The pads 903a and 904a are in contact with the lumino-disk 901.

FIG. 9C shows x-electrode 904 with pad 904a and y-electrode pad 903a with y-electrode via 903b on the substrate 902 with pads 903a, 904a forming an incomplete circular configuration for contact with the lumino-disk 901a (not shown in FIG. 9C) to be positioned on the substrate 902.

FIG. 10 shows substrate 1002 with y-electrodes 1003 positioned in trenches or grooves 1008, x-electrodes 1004, and lumino-disk locating notches 1009. The lumino-disks 1001 are located within the trenches or grooves 1008 at the positions of the locating notches 1009 as shown. The y-electrodes 1003 and x-electrodes 1004 are cross-hatched for identification purposes.

FIG. 10A is a Section View 10A-10A of FIG. 10 and FIG. 10B is a Section View 10B-10B of FIG. 10, each Section View showing each lumino-disk 1001 mounted within a trench or groove 1008 and attached to the substrate 1002 with bonding material 1005. Each lumino-disk 1001 is in contact with a top x-electrode 1004 and a bottom y-electrode 1003. Luminescent material is not shown, but may be provided near or on each lumino-disk 1001. Inner-pixel light barriers are not shown, but may be provided.

FIG. 11 shows substrate 1102 with y-electrodes 1103, x-electrodes 1104, and lumino-disk wells 1108. The lumino-disks 1101 are located within wells 1108 as shown. The y-electrodes 1103 and x-electrodes 1104 are cross-hatched for identification purposes.

FIG. 11A is a Section View 11A-11A of FIG. 11 and FIG. 11B is a Section View 11B-11B of FIG. 11, each Section View showing each lumino-disk 1101 within a well 1108 to substrate 1102 with bonding material 1105. Each lumino-disk 1101 is in contact with a top x-electrode 1104 and a bottom y-electrode 1103. Luminescent material is not shown, but may be provided near or on each lumino-disk. Inner-pixel light barriers are not shown, but may be provided. The x-electrodes 1104 are positioned under a transparent cover 1110 and may be integrated into the cover.

FIGS. 12, 12A, 12B, and 12C are several views of an alternate two-electrode configuration or embodiment in which neither the x nor the y electrode extends over the lumino-disk 1201.

Figure 12:
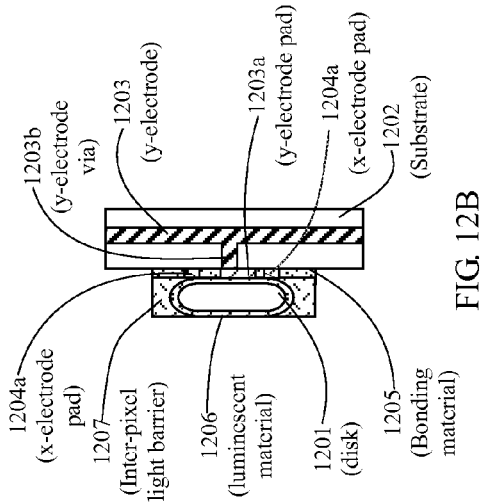
FIG. 12 is a top view of a lumino-disk mounted on a substrate with one x-electrode and one y-electrode.

FIG. 12 shows substrate 1202 with x-electrode 1204, luminescent material 1206, and inter-pixel light barrier 1207. The x-electrode 1204 is cross-hatched for identification purposes.

Figure 12B:
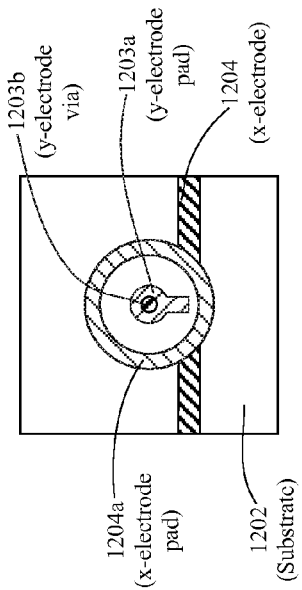
FIG. 12B is a Section View of 12B-12B of FIG. 12.
Figure 12A:
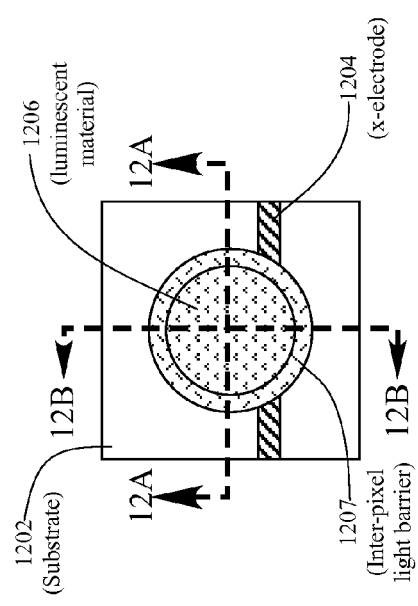
FIG. 12A is a Section View 12A-12A of FIG. 12.

FIG. 12A is a Section View 12A-12A of FIG. 12 and FIG. 12B is a Section View 12B-12B of FIG. 12, each Section View showing the lumino-disk 1201 mounted on the surface of substrate 1202 with bottom y-electrode 1203 and bottom x-electrode pad 1204a, inter-pixel light barrier 1207, and luminescent material 1206. The lumino-disk 1201 is bonded to the substrate 1202 with bonding material 1205. Also shown is y-electrode pad 1203a and via 1203b connected to y-electrode 1203. The pads 1203a and 1204a are in contact with the lumino-disk 1201.

Figure 12C:
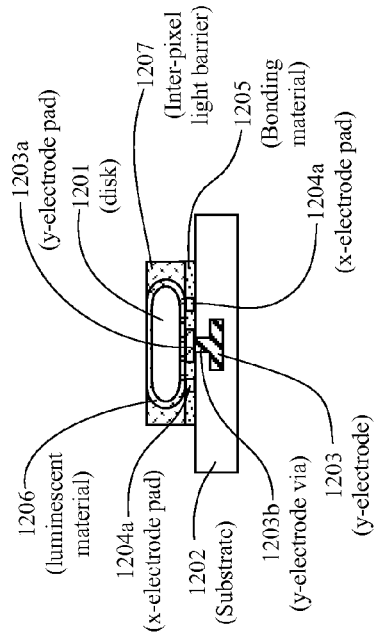
FIG. 12C is a top view of the substrate and electrodes in FIG. 12 without the disk

FIG. 12C shows x-electrode 1204 with pad 1204a and y-electrode pad 1203a with y-electrode via 1203b on the surface 1202. The pad 1204a forms a donut configuration for contact with the lumino-disk 1201 (not shown) to be positioned on the substrate 1202. The pad 1203a is shown as a keyhole configuration within the donut configuration and centered within electrode pad 1204a.

FIGS. 13, 13A, 13B, and 13C are several views of an alternate two-electrode configuration and embodiment in which neither the x- nor the y-electrode extends over the lumino-disk 1301. These figures illustrate charge or capacitive coupling.

FIG. 13 shows dielectric film or layer 1302a on top surface of substrate 1302 (not shown) with x-electrode 1304, luminescent material 1306, and inter-pixel light barrier 1307. The x-electrode 1304 is cross-hatched for identification purposes.

FIG. 13A is a Section View 13A-13A of FIG. 13 and FIG. 13B is a Section View 13B-13B of FIG. 13, each Section View showing the lumino-disk 1301 mounted on the dielectric film or layer 1302a with y-electrode 1303 and x-electrode pad 1304a, inter-pixel light barrier 1307, and luminescent material 1306. The lumino-disk 1301 is bonded to the dielectric film 1302a with bonding material 1305. Also shown is substrate 1302 and y-electrode pad 1303a which is capacitively coupled through dielectric film 1302a to the y-electrode 1303.

FIG. 13C shows the x-electrode 1304 x-electrode pad 1304a, and y-electrode pad 1303a on the substrate 1302 with the location of the lumino-disk 1301 (not shown) indicated by the semi-circular pads 1303a and 1304a.

In this configuration and embodiment, x-electrode 1304 is on the top of the substrate 1302 and y-electrode 1303 is embedded in substrate 1302. Also in this embodiment, substrate 1302 is formed from a material with a dielectric constant sufficient to allow charge coupling from 1303 to 1303a. Also to promote good capacitive coupling, pad 1303a is large and the gap between 1303a and 1303 is small. Pads 1303a and 1304a may be selected from a reflective metal such as copper or silver or coated with a reflective material. This will help direct light out of the lumino-disk and increase efficiency. Reflective electrodes may be used in any configuration in which the electrodes are attached to the lumino-disk from the back of the substrate. The larger the area of the electrode, the greater the advantage achieved by reflection.

FIGS. 14, 14A, 14B, and 14C are several views of an alternate two-electrode configuration and embodiment.

FIG. 14 shows dielectric film or layer 1402a on the top surface of substrate 1402 (not shown) with x-electrode 1404, luminescent material 1406, and inter-pixel light barrier 1407. The x-electrode 1404 is cross-hatched for identification purposes.

FIG. 14A is a Section View 14A-14A of FIG. 14 and FIG. 14B is a Section View 14B-14B of FIG. 14, each Section View showing the lumino-disk 1401 mounted on the surface of dielectric film 1402a with bottom y-electrode 1403, bottom x-electrode pad 1404a, inter-pixel light barrier 1407, and luminescent material 1406. The lumino-disk 1401 is bonded to the dielectric film 1402a with bonding material 1405. Also shown are substrate 1402 and y-electrode pad 1403a which is capacitively coupled through the dielectric film 1402a to the y-electrode 1403.

FIG. 14C shows x-electrode 1404 and electrode pads 1403a and 1404a on the substrate 1402. The pads 1403a and 1404a form an incomplete circular configuration for contact with the lumino-disk 1401 (not shown in FIG. 14C).

FIG. 14 differs from FIG. 13 in the shape of the electrode pads. This can be seen in FIG. 14C. Y-electrode 1403a is shaped like a 'C' and X-electrode 1404 is also formed as a 'C' shape. This configuration promotes a positive column discharge.

FIGS. 15, 15A, 15B, and 15C are several views of an alternate two-electrode configuration and embodiment. These figures illustrate charge or capacitive coupling.

FIG. 15 shows dielectric film or layer 1502a on the surface of substrate 1502 (not shown) with bottom x-electrode 1504, luminescent material 1506 and inter-pixel light barrier 1507. The x-electrode 1504 is cross-hatched for identification purposes.

FIG. 15A is a Section View 15A-15A of FIG. 15 and FIG. 15B is a Section View 15B-15B of FIG. 15, each Section View showing the lumino-disk 1501 mounted on the surface of dielectric film 1502a with bottom y-electrode 1503 and bottom x-electrode 1504, inter-pixel light barrier 1507, and luminescent material 1506. The lumino-disk 1501 is bonded to the dielectric film 1502a with bonding material 1505. The lumino-disk 1501 is capacitively coupled through dielectric film 1502a and bonding material 1505 to y-electrode 1503. Also shown is substrate 1502.

FIG. 15C shows the x-electrode 1504 with x-electrode pad 1504a on the substrate 1502 with the location of the lumino-disk 1501 (not shown) indicated with broken lines.

FIGS. 16, 16A, 16B, and 16C are several views of an alternate two-electrode configuration and embodiment.

Figure 16:
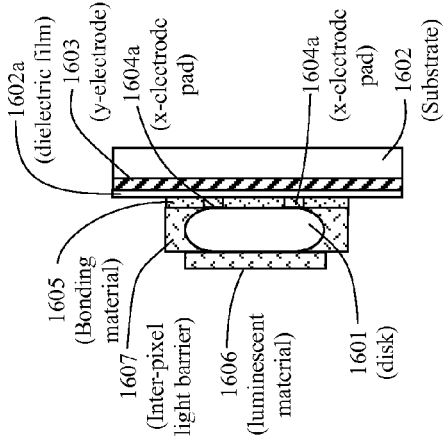
FIG. 16 is a top view of a lumino-disk mounted on a substrate with one x-electrode and one y-electrode.

FIG. 16 shows dielectric film or layer 1602a on substrate 1602 (not shown) with bottom x-electrode 1604, luminescent material 1606, and inter-pixel light barrier 1607. The x-electrode 1604 is cross-hatched for identification purposes.

Figure 16A:
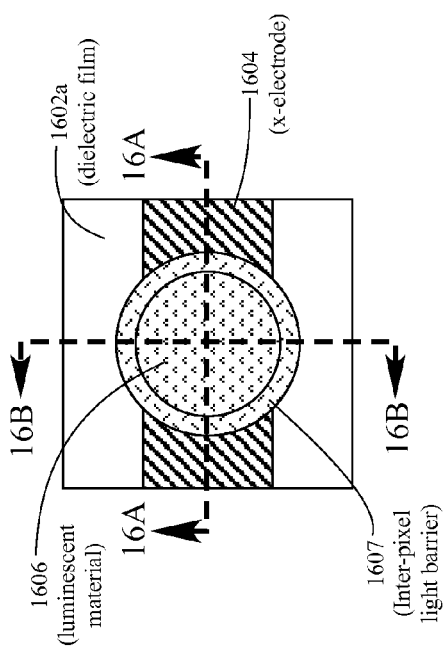
FIG. 16A is a Section View 16A-16A of FIG. 16.
Figure 16B:
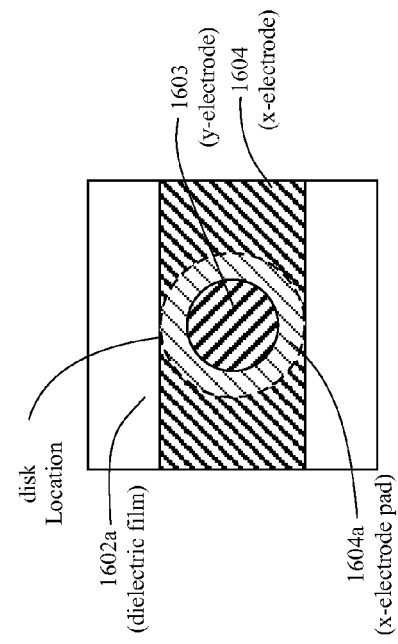
FIG. 16B is a Section View of 16B-16B of FIG. 16.

FIG. 16A is a Section View 16A-16A of FIG. 16 and FIG. 16B is a Section View 16B-16B of FIG. 16, each Section View showing the lumino-disk 1601 mounted on the surface of dielectric film 1602a with bottom y-electrode 1603 and bottom x-electrode pad 1604a, inter-pixel light barrier 1607, and luminescent material 1606. The lumino-disk 1601 is bonded to the dielectric film 1602a with bonding material 1605.

Figure 16C:
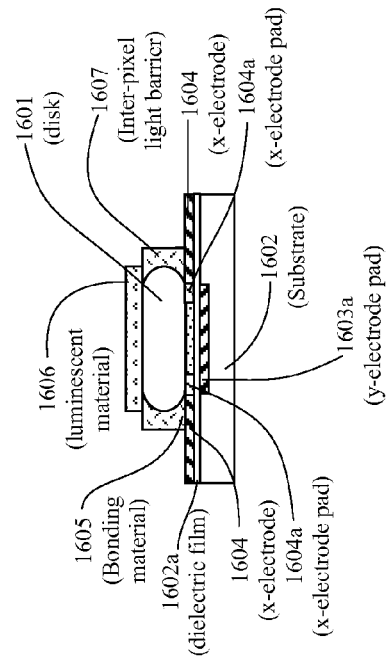
FIG. 16C is a top view of the substrate and electrodes in FIG. 16 with the disk location shown in broken lines.

FIG. 16C shows the x-electrode 1604 with pad 1604a and y-electrode 1603 on the substrate 1602 with the location of the lumino-disk 1601 (not shown) indicated with broken lines.

FIG. 16 differs from FIG. 15 in the shape of the x and y electrodes. This can be seen in FIG. 16C. The x-electrode 1604 is extended along the top surface of substrate 1602. A spherical hole is cut in x-electrode 1604 to allow capacitive coupling of y-electrode 1603 to the lumino-disk. The y-electrode 1603 is perpendicular to x-electrode 1604.

FIGS. 17, 17A, 17B, and 17C are several views of an alternate two-electrode configuration and embodiment.

FIG. 17 shows dielectric film or layer 1702a on substrate 1702 (not shown) with bottom x-electrode 1704, luminescent material 1706, and inter-pixel light barrier 1707. The x-electrode 1704 is cross-hatched for identification purposes.

FIG. 17A is a Section View 17A-17A of FIG. 17 and FIG. 17B is a Section View 17B-17B of FIG. 17, each Section View showing the lumino-disk 1701 mounted on the surface of dielectric film or layer 1702a with bottom y-electrode 1703, bottom x-electrode 1704 and x-electrode pad 1704a, inter-pixel light barrier 1707, and luminescent material 1706. The lumino-disk 1701 is bonded to the dielectric layer 1702a with bonding material 1705.

FIG. 17C shows the electrode 1704 with pad 1704a on the substrate 1702 with the location of the lumino-disk 1701 (not shown) indicated with broken lines.

FIG. 17 serves to illustrate that the y-electrode 1703 may be applied to the top of substrate 1702 as shown in FIG. 17B. Dielectric layer or film 1702a is applied over the substrate and the y-electrode. The x-electrode 1704 is applied over the dielectric layer to make direct contact with lumino-disk 1701. In this embodiment substrate 1702 contains embossed depression 1711 to bring y-electrode 1703 closer to the surface of the lumino-disk and in essentially the same plane as x-electrode pad 1704a.

FIG. 18 shows dielectric film or layer 1802a substrate 1802 (not shown) with bottom x-electrode 1804, luminescent material 1806, and inter-pixel light barrier 1807. The x-electrode 1804 is cross-hatched for identification purposes.

FIG. 18A is a Section View 18A-18A of FIG. 18 and FIG. 18B is a Section View 18B-18B of FIG. 18, each Section View showing a lumino-dome 1801 mounted on the surface of dielectric 1802a with connecting bottom y-electrode 1803, inter-pixel light barrier 1807, and luminescent material 1806. The lumino-dome 1801 is bonded to the substrate 1802a with bonding material 1805. Also shown are substrate 1802, y-electrode pad 1803a and x-electrode pad 1804a. Magnesium oxide 1812 is shown on the inside of the lumino-dome 1801.

FIG. 18C shows the electrode 1804 with pad 1804a and pad 1803a on the substrate 1802 with the location of the lumino-dome 1801 (not shown) by semi-circular pads 1804a and 1803a.

In another embodiment, the lumino-shell contains luminescent substances such as phosphors selected to provide different visible colors including red, blue, and green for use in a full color display. The metal or metalloid oxides are typically selected to be highly transmissive to photons produced by the gas discharge especially in the UV range.

The internal or external surface of the lumino-shell may be partially or completely coated with luminescent material. In one preferred embodiment the external surface is completely coated with luminescent material.

The bottom or rear of the lumino-shell may be coated with a suitable light reflective material in order to reflect more light toward the top or front viewing direction of the lumino-shell. The light reflective material may be applied by any suitable process such as spraying, ink jet, dipping, and so forth. Thick film methods such as screen-printing may be used. Thin film methods such as sputtering and vapor phase deposition may be used. The light reflective material may be applied over the luminescent material or the luminescent material may be applied over the light reflective material. In one embodiment, the electrodes are made of or coated with a light reflective material such that the electrodes also may function as a light reflector.

Lumino-Disk

A lumino-shell with two substantially flattened opposite sides, i.e., top and bottom is called a lumino-disk. A lumino-disk may be formed by flattening a lumino-sphere on one or more pairs of opposing sides such as top and bottom. The flattening of the lumino-sphere to form a lumino-disk is typically done while the lumino-sphere is at an ambient temperature or at elevated softening temperature below the melting temperature. The flat viewing surface in a lumino-disk tends to increase the overall luminous efficiency of a display.

Figure 19A:
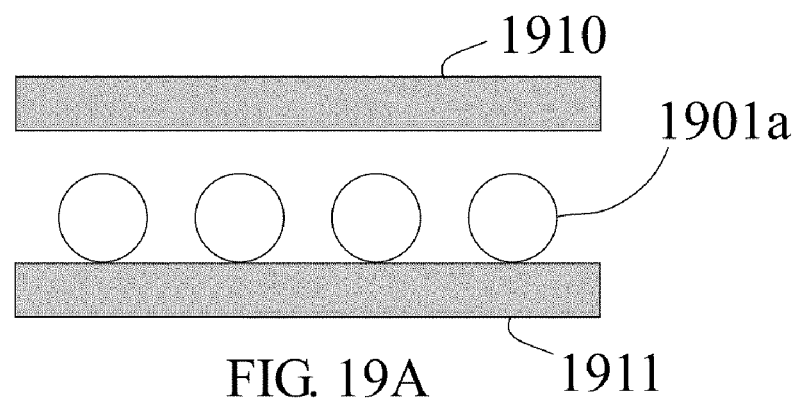
FIGS. 19A, 19B, and 19C show process steps for making lumino-disks.
Figure 19B:
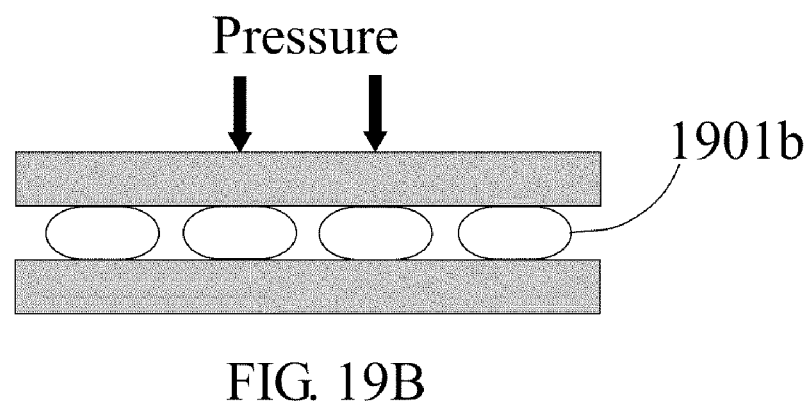
Figure 19C:
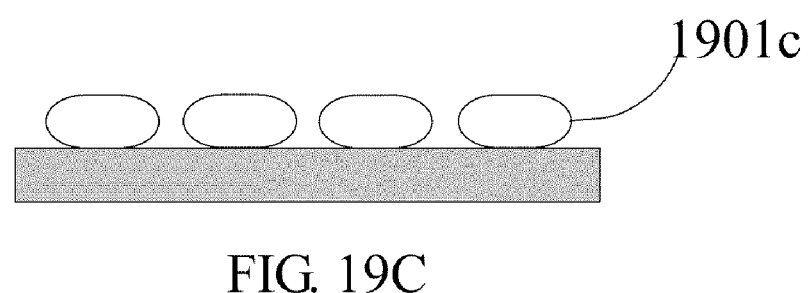

Lumino-disks are typically produced while the lumino-sphere is at an elevated temperature below its melting point. While the lumino-sphere is at the elevated temperature, a sufficient pressure or force is applied with member 1910 to flatten the lumino-spheres between members 1910 and 1911 into lumino-disk shapes with flat top and bottom as illustrated in FIGS. 19A, 19B, and 19C. FIG. 19A shows a lumino-sphere. FIG. 19B shows uniform pressure applied to the lumino-sphere to form a flattened lumino-disk 1901b. Heat can be applied during the flattening process such as by heating members 1910 and 1911. FIG. 19C shows the resultant flat lumino-disk 1901C. One or more luminescent substances can be applied to the lumino-disk. Like a coin that can only land "heads" or "tails", a lumino-disk with a flat top and flat bottom may be applied to a substrate in one of two flat positions. However, in some embodiments, the lumino-disk may be positioned on edge on or within the substrate.

Lumino-Dome

Figure 20:
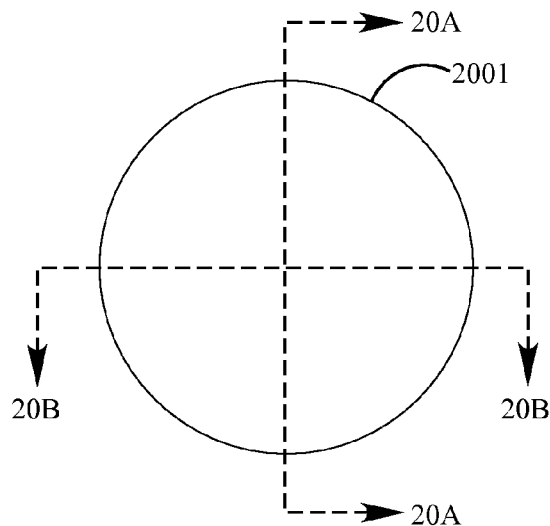
FIGS. 20, 20A, and 20B show a lumino-dome with one flat side.
Figure 20A:
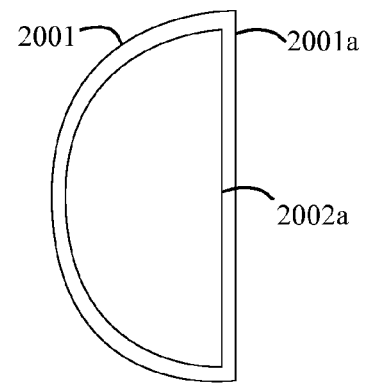
Figure 20B:
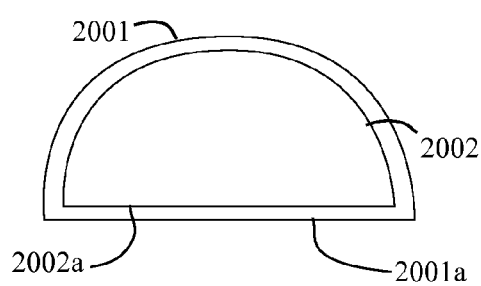

A lumino-dome is shown in FIGS. 20, 20A, and 20B. FIG. 20 is a top view of a lumino-dome showing an outer lumino-shell wall 2001. FIG. 20A is a section 20A-20A view of FIG. 20 showing a flattened outer wall 2001a and flattened inner wall 2002a. FIG. 20B is a section 20B-20B view of FIG. 20.

Figure 21:
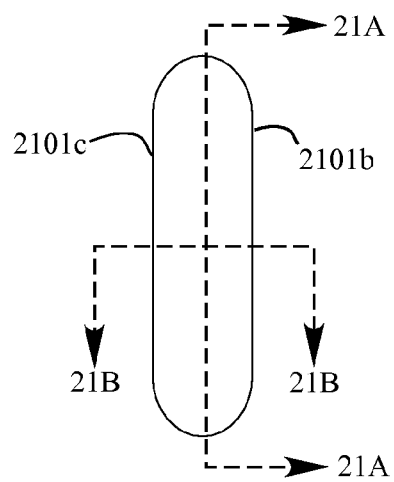
FIGS. 21, 21A, and 21B show a lumino-dome with multiple flat sides.
Figure 21A:
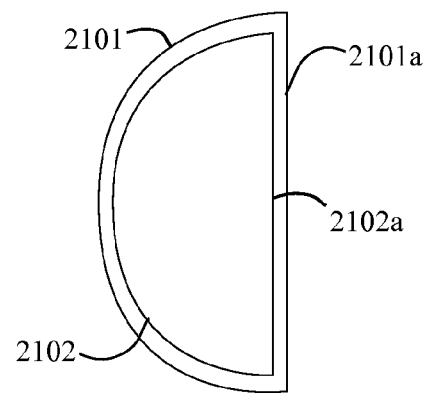
Figure 21B:
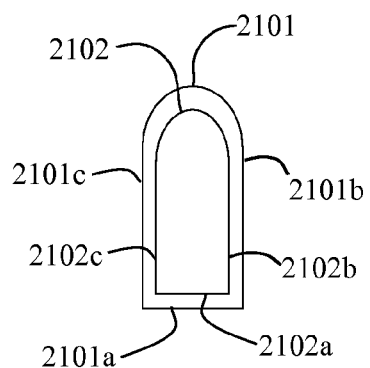

FIG. 21 is a top view of a lumino-dome with flattened outer lumino-shell wall 2101b and 2101c. FIG. 21A is a section 21A-21A view of FIG. 21 showing flattened outer wall 2101a and flattened inner wall 2102a with a lumino-dome having outer wall 2101 and inner wall 2102. FIG. 21B is a section 21B-21B view of FIG. 21. In forming a display, the lumino-dome portion may be positioned within the substrate with the flat side up in the viewing direction or with the lumino-dome portion up in the viewing direction.

Figure 22:
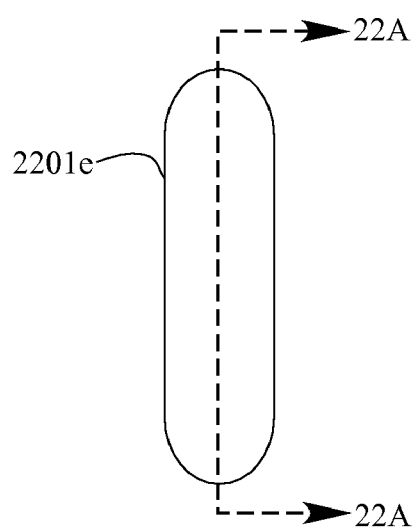
FIGS. 22 and 22A show a lumino-disk.
Figure 22A:
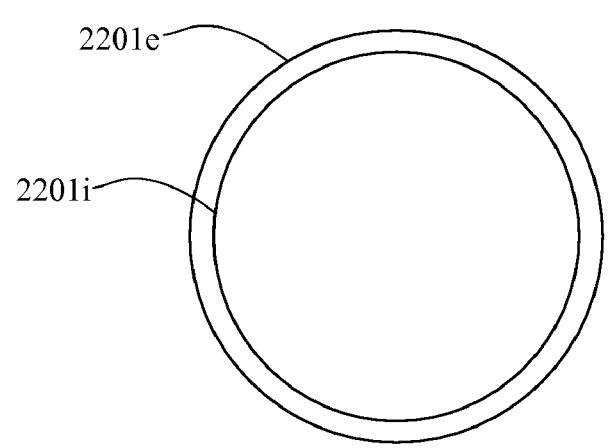

FIGS. 22 and 22A show a lumino-disk with opposite flat sides exterior surface of 2201e. FIG. 22 is a section 22A-22A view of FIG. 22.

Figure 23:
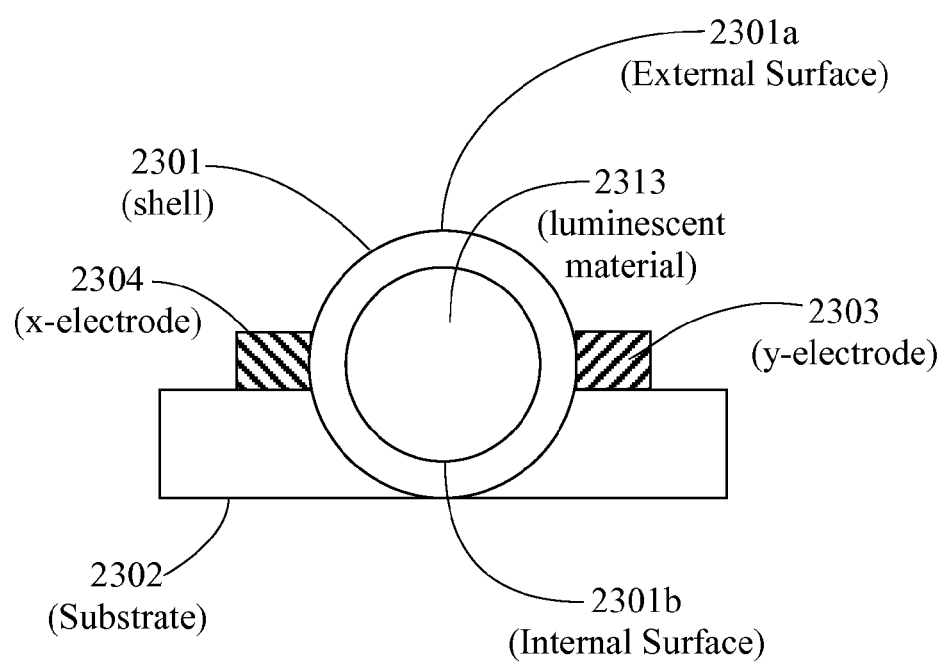
FIG. 23 shows a lumino-shell mounted on a substrate as a display pixel element.

In one embodiment of this invention, the lumino-shell is used as the pixel element of a single substrate display device as shown in FIG. 23. In FIG. 23 the lumino-shell 2301 is shown as a lumino-sphere, but may be a lumino-disk or lumino-dome. For the assembly of multiple display cells or pixels, it is contemplated using lumino-disks alone or in combination with other lumino-shells such as lumino-spheres or lumino-domes. In FIG. 23 the lumino-shell 2301 has an external surface 2301a and an internal surface 2301b and is positioned in a well or cavity on a display substrate 2302. It is composed of a material selected to have the properties of transmissivity to light, while being sufficiently impermeable as to the confined luminescent material 2313. The material 2313 is selected so as to produce light in the visible and/or visible range when a voltage is applied to electrodes 2304 and 2303.

Radio Frequency

The lumino-shells may be operated with radio frequency (RF). The use of RF in a display is disclosed in U.S. Pat. Nos. 6,271,810 (Yoo et al.), 6,340,866 (Yoo), 6,473,061 (Lim et al.), 6,476,562 (Yoo et al.), 6,483,489 (Yoo et al.), 6,501,447 (Kang et al.), 6,605,897 (Yoo), 6,624,799 (Kang et al.), 6,661,394 (Choi), and 6,794,820 (Kang et al.), all incorporated herein by reference.

Lumino-Shell Materials

The lumino-shell may be constructed of any suitable material including glass, ceramic, plastic, metal, metalloids, and so forth. It is contemplated that the shell may be made of suitable inorganic compounds of metals and/or metalloids, including mixtures or combinations thereof. Contemplated inorganic compounds include the oxides, carbides, nitrides, nitrates, silicates, silicides, aluminates, phosphates, sulphates, sulfides, borates, and borides.

The metals and/or metalloids are selected from lithium, sodium, potassium, rubidium, cesium, magnesium, calcium, strontium, barium, scandium, yttrium, lanthanum, cerium, praseodymium, neodymium, promethium, samarium, europium, gadolinium, terbium, erbium, actinium, thorium, protactinium, uranium, neptunium, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, copper, silver, zinc, cadmium, boron, aluminum, gallium, indium, thallium, carbon, silicon, germanium, tin, lead, phosphorus, arsenic, antimony and bismuth.

Suitable inorganic materials include magnesium oxide(s), aluminum oxide(s), zirconium oxide(s), and silicon carbide (s) such as MgO, $Al_2O_3$, $ZrO_2$, $SiO_2$, and/or SiC.

In one embodiment, the shell is composed wholly or in part of one or more borides of one or more members of Group IIIB of the Periodic Table and/or the rare earths including both the Lanthanide Series and the Actinide Series of the Periodic Table. Contemplated Group IIIB borides include scandium boride and yttrium boride. Contemplated rare earth borides of the Lanthanides and Actinides include lanthanum boride, cerium boride, praseodymium boride, neodymium boride, gadolinium boride, terbium boride, actinium boride, and thorium boride.

In one embodiment, the shell is composed wholly or in part of one or more Group IIIB and/or rare earth hexaborides with the Group IIIB and/or rare earth element being one or more members selected from Sc, Y, La, Ce, Pr, Nd, Sm, Eu, Gd, Tb, Dy, Ho, Yb, Ac, Th, Pa, and U. Examples include lanthanum hexaboride, cerium hexaboride, and gadolinium hexaboride.

Rare earth borides, including rare earth hexaboride compounds, and methods of preparation are disclosed in U.S. Pat. Nos. 3,258,316 (Tepper et al.), 3,784,677 (Versteeg et al.), 4,030,963 (Gibson et al.), 4,260,525 (Olsen et al.), 4,999,176 (Iltis et al.), 5,238,527 (Otani et al.), 5,336,362 (Tanaka et al.), 5,837,165 (Otani et al.), and 6,027,670 (Otani et al.), all incorporated herein by reference.

Group IIA alkaline earth borides are contemplated including borides of Mg, Ca, Ba, and Sr. In one embodiment, there is used a material containing trivalent rare earths and/or trivalent metals such as La, Ti, V, Cr, Al, Ga, and so forth having crystalline structures similar to the perovskite structure, for example as disclosed in U.S. Pat. No. 3,386,919 (Forrat), incorporated herein by reference.

The shell may also be composed of or contain carbides, borides, nitrides, silicides, sulfides, oxides and other compounds of metals and/or metalloids of Groups IV and V as disclosed and prepared in U.S. Pat. No. 3,979,500 (Sheppard et al.), incorporated herein by reference. Compounds including borides of Group IVB metals such as titanium, zirconium, and hafnium and Group VB metals such as vanadium, niobium, and tantalum are contemplated.

In one embodiment, the shell is made of fused particles of glass, ceramic, glass ceramic, refractory, fused silica, quartz, or like amorphous and/or crystalline materials including mixtures of such. The ceramic material may be selected based on its transmissivity to light after firing. This includes selecting ceramic material with various optical cutoff frequencies to produce various colors. One material contemplated for this application is aluminum oxide. Aluminum oxide is transmissive from the UV range to the IR range. Because it is transmissive in the UV range, luminescent materials such as phosphors excited by UV may be applied to the exterior of an aluminum oxide to produce various colors. The application of the phosphor to the exterior of the shell may be executed by any suitable means before or after the shell is positioned on or in the substrate. Several layers or coatings of phosphors, each of a different composition, can be applied to the exterior of the shell.

In one embodiment, the shell is made of an aluminate silicate or contains a layer of aluminate silicate. The shell may be made of lead silicates, lead phosphates, lead oxides, borosilicates, alkali silicates, aluminum oxides, and pure vitreous silica.

The shell may be made in whole or in part from one or more materials such as magnesium oxide having a Townsend coefficient. These include inorganic compounds of magnesium, calcium, strontium, barium, gallium, lead, aluminum, boron, and the rare earths especially lanthanum, cerium, actinium, and thorium. The contemplated inorganic compounds include oxides, carbides, nitrides, nitrates, silicates, silicides, aluminates, phosphates, sulphates, sulfides, borates, borides, and other inorganic compounds of the above and other elements.

The shell may also contain or be partially or wholly constructed of luminescent materials such as inorganic and/or organic phosphor(s). The phosphor may be a continuous or discontinuous layer or coating of inorganic and/or organic substance on the interior or exterior of the shell. Inorganic and/or organic luminescent particles may also be introduced inside the shell or embedded within the shell. Inorganic and/or organic luminescent quantum dots may also be incorporated into the shell.

Conductive Lumino-Shell

The lumino-shell may be made, wholly or in part, of a conductive material as discussed below. The shell can include conductive materials particularly metals or metalloid oxides, such as used for electrodes, especially the cathode. The following references disclose conductive materials that can be used in the shell and/or electrodes.

U.S. Pat. No. 6,797,662 (Jaffrey) discloses electrically conductive ceramics. A metal oxide ceramic material such as alumina may be rendered electrically conductive through its thickness by the incorporation of silver into the material. U.S. Pat. No. 6,631,062 (Minamisawa et al.) discloses an electrically conductive ceramic material and a process of producing same. The material comprises a compound containing at least one element belonging to the Group IIIA of the Periodic Table and $TiO_{2-x}$ where ($0<x<2$) is in a range such that the $TiO_2$, ($0<x<2$) accounts for 1% to 60% by weight % of the total amount of the ceramics, and at least part of the compound and the $TiO_{2-x}$ form a composite oxide. U.S. Pat. No. 6,531,408 (Iwata et al.) discloses a method for growing zinc oxide based semi-conductor layers. U.S. Pat. No. 6,146,552 (Iga et al.) discloses a method for producing zinc oxide for low and high voltages. U.S. Pat. Nos. 5,770,113 (Iga et al.) 'and 5,739,742 (Iga et al.) disclose zinc oxide compositions including methods of preparation.

U.S. Pat. No. 5,795,502 (Terashi et al.) discloses electrically conducting ceramics and/or process for producing the same. The electrically conducting ceramics have as a chief crystalline phase a perovskite crystalline phase containing La, Cr and Mg and also having, in addition to the chief crystalline phase, an oxide phase containing La. The ceramics are dense, exhibit excellent sintering properties at low temperatures, have high electrical conductivity, and remain stable in a reducing atmosphere. U.S. Pat. Nos. 5,656,203 (Mikesha) and 5,601,853 (Bednarz et al.) disclose electrically conductive ceramics with oxides of Al, Cr, and Mg such as alumina, chromia, and magnesia. Ceramics are disclosed which exhibit volume resistivities of 1012 ohm-cm or less at 20° C. and have excellent electrical stability and superior mechanical properties.

U.S. Pat. No. 5,604,048 (Nishihara et al.) discloses an electrically conducting ceramic having improved electrical conductivity, which comprises a perovskite-type composite oxide. U.S. Pat. No. 5,688,731 (Chatterjee et al.) discloses a ceramic composite containing doped zirconia having high electrical conductivity. These electrically conductive ceramics comprise tetragonal zirconia or a composite of zirconia-alumina and zirconium diboride. U.S. Pat. No. 5,397,920 (Tran) discloses light transmissive electrically conductive compositions including methods of preparation. U.S. Pat. No. 5,126,218 (Clarke) discloses a conductive ceramic substrate for batteries formed from a sub-stiochemetric titanium dioxide material. The disclosed preferred material is $TiO_x$, where x is in the region of 1.55 to 1.95.

U.S. Pat. No. 5,066,423 (Kubo et al.) discloses a conductive ceramic sintered body substantially free from large variation of electric resistivity, which consists essentially of: (a) a silicon nitride-base ceramic as a matrix; (b) 10% to 70% volume of a first conductive material which consists of one or more conductive compounds selected from carbides, nitrides, oxides and their composite compounds of transition metals in Groups IVa, Va and VIa of the Periodic Table; and (c) 0.1% to 50% volume of a second conductive material consisting of SiC; the first conductive material and the second conductive material serving to form paths for electric conduction. U.S. Pat. No. 4,795,723 (Nishikawa et al.) discloses an electrically conductive hot press sintered ceramic comprising boron nitride, titanium diboride and aluminum nitride and having a flexural strength of at least 900 kg/cm² with a specific resistance of 300 to 2,500 micro ohm-centimeter (μΩ-cm). U.S. Pat. No. 4,645,622 (Keck) discloses an electrically conductive ceramic having the composition $La_x Ca_y MnO_3$ where x is 0.44 to 0.48, y is 0.42 to 0.50 and the sum of the mol numbers of La and Ca is between 1% to 15% (preferably about 10%) and smaller than the mol number of Mn.

U.S. Pat. No. 4,113,928 (Virkar et al.) discloses the preparation of dense, high strength, and electrically conductive ceramics containing β"-alumina. There is prepared a dense and strong polycrystalline β"-alumina-containing ceramic body exhibiting an electrical resistivity for sodium ion conduction at 300° C. of 9 ohm-cm or lower obtained directly after sintering and having a controlled fine microstructure exhibiting a uniform grain size under 50 micrometers. The reference discloses methods of uniformly distributing selected metal ions having a valence not greater than 2, e.g. lithium or magnesium, uniformly throughout the beta-type alumina composition prior to sintering to form β"-alumina. This uniform distribution allows more complete conversion of β-alumina to β"-alumina during sintering. As a result, the polycrystalline β"-alumina containing ceramic bodies obtained by these methods exhibit high density, low porosity, high strength, fine grain size (i.e. no grains over 25-50 micrometers with an average size under 5-10 micrometers), low electrical resistivity and a high resistance to degradation by water vapor in an ambient atmosphere.

Secondary Electron Emission

The shell may be made of secondary electron emission (Townsend coefficient) materials. Such is disclosed in U.S.

Pat. No. 3,716,742 (Nakayama et al.). The use of Group IIA compounds including magnesium oxide is disclosed in U.S. Pat. Nos. 3,836,393 (Ernsthausen et al.) and 3,846,171 (Byrum et al.). The use of rare earth compounds in an AC plasma display is disclosed in U.S. Pat. Nos. 4,126,807, 4,126,809, and 4,494,038, all issued to Wedding et al. Lead oxide may also be used as a secondary electron material. Mixtures of secondary electron emission materials may be used.

In one embodiment, the secondary electron emission material is magnesium oxide on part or all of the internal surface of a shell. The secondary electron emission material may also be on the external surface. The thickness of the magnesium oxide ranges from about 250 Angstrom Units to about 10,000 Angstrom Units (Å). The entire shell may be made of a secondary electronic material such as magnesium oxide.

Ionizable Gas

The hollow lumino-shell may contain one or more ionizable gas components that are ionized and/or discharged by a high energy transmission. The gas may be selected to emit photons in the visible, IR, and/or UV spectrum during ionization and/or gas discharge. The photons may be utilized to excite a luminescent material.

As used herein, gas means one or more gas components. In the practice of this invention, the gas is typically selected from a mixture of the rare gases of neon, argon, xenon, krypton, helium, and/or radon. The rare gas may be a Penning gas mixture. Other contemplated gases include nitrogen, $CO_2$, CO, mercury, halogens, excimers, oxygen, hydrogen, and mixtures thereof. Isotopes of the above and other gases are contemplated. These include isotopes of helium such as helium-3, isotopes of hydrogen such as deuterium (heavy hydrogen), tritium ($T^3$) and DT, isotopes of the rare gases such as xenon-129, and isotopes of oxygen such as oxygen-18. Other isotopes include deuterated gases such as deuterated ammonia ($ND_3$) and deuterated silane ($SiD_4$). In one embodiment, a two-component gas mixture (or composition) is used such as a mixture of neon and argon, neon and xenon, neon and helium, neon and krypton, argon and xenon, argon and krypton, argon and helium, xenon and krypton, xenon and helium, and krypton and helium. Specific two-component gas mixtures (compositions) include about 5% to 90% atoms of argon with the balance xenon. Another two-component gas mixture is a mother gas of neon containing 0.05% to 15% atoms of xenon, argon, and/or krypton. This can also be a three-component gas, four-component gas, or five-component gas by using quantities of an additional gas or gases selected from xenon, argon, krypton, and/or helium. In another embodiment, a three-component ionizable gas mixture is used such as a mixture of argon, xenon, and neon wherein the mixture contains at least 5% to 80% atoms of argon, up to 15% xenon, and the balance neon. The xenon is present in a minimum amount sufficient to maintain the Penning effect. Such a mixture is disclosed in U.S. Pat. No. 4,926,095 (Shinoda et al.), incorporated herein by reference. Other three-component gas mixtures include argon-helium-xenon, krypton-neon-xenon, and krypton-helium-xenon for example as disclosed in U.S. Pat. Nos. 5,510,678 (Sakai et al.) and 5,559,403 (Sakai et al.), incorporated herein by reference.

U.S. Pat. No. 4,081,712 (Bode et al.), incorporated herein by reference, discloses the addition of helium to a gaseous medium of 90% to 99.99% atoms of neon and 10% to 0.01% atoms of argon, xenon, and/or krypton. In one embodiment, there is used a high concentration of helium with the balance selected from one or more gases of neon, argon, xenon, and nitrogen as disclosed in U.S. Pat. No. 6,285,129 (Park) incorporated herein by reference. Mercury may also be added to the rare gases as disclosed in U.S. Pat. No. 4,041,345 (Sahni), incorporated herein by reference.

A high concentration of xenon may also be used with one or more other gases as disclosed in U.S. Pat. No. 5,770,921 (Aoki et al.), incorporated herein by reference. Pure neon may be used and the shells operated using the architecture disclosed by U.S. Pat. No. 3,958,151 (Yano) discussed above and incorporated herein by reference. In some embodiments, a radioactive gas such as radon may be used alone or in combination with other gases.

Excimers

Excimer gases may also be used as disclosed in U.S. Pat. Nos. 4,549,109 (Nighan et al.) and 4,703,229 (Nighan et al.), both incorporated herein by reference. Nighan et al. ('109) and ('229) disclose the use of excimer gases formed by the combination of halides with inert gases. The halides include fluorine, chlorine, bromine, and iodine. The inert gases include helium, xenon, argon, neon, krypton, and radon. Excimer gases may emit red, blue, green, or other color light in the visible range or light in the invisible range. The excimer gases may be used alone or in combination with phosphors. U.S. Pat. No. 6,628,088 (Kim et al.), incorporated herein by reference, also discloses excimer gases for a PDP.

Other Gases

Depending upon the application, a wide variety of gases is contemplated. In addition to displays, other applications include devices for detecting radiation or antenna applications including radar transmissions. Such other gases include $C_2H_2$—$CF_4$—Ar mixtures as disclosed in U.S. Pat. Nos. 4,201,692 (Christophorou et al.) and 4,309,307 (Christophorou et al.), both incorporated herein by reference. Also contemplated are gases disclosed in U.S. Pat. No. 4,553,062 (Ballon et al.), incorporated herein by reference. Other gases include sulfur hexafluoride, HF, $H_2S$, $SO_2$, SO, $H_2O_2$, and so forth.

Display Structure

The lumino-shells may be located on or in a single substrate or monolithic display structure. Single substrate display structures are disclosed in U.S. Pat. Nos. 3,646,384 (Lay), 3,652,891 (Janning), 3,666,981 (Lay), 3,811,061 (Nakayama et al.), 3,860,846 (Mayer), 3,885,195 (Amano), 3,935,494 (Dick et al.), 3,964,050 (Mayer), 4,106,009 (Dick), 4,164,678 (Biazzo et al.), and 4,638,218 (Shinoda), all cited above. The display shells may be positioned on the surface of the substrate and/or positioned in the substrate such as in channels, trenches, grooves, wells, cavities, hollows, and so forth. These channels, trenches, grooves, wells, cavities, hollows, etc., may extend through the substrate so that the shells positioned therein may be viewed from either side of the substrate.

The shells may also be positioned on or in a substrate within a dual substrate display structure. In one embodiment, each shell is placed inside of display device, for example, on the substrate along the channels, trenches or grooves between the barrier walls of a display barrier structure such as disclosed in U.S. Pat. Nos. 5,661,500 (Shinoda et al.) 5,674,553 (Shinoda et al.), and 5,793,158 (Wedding). The shells may also be positioned within a cavity, well, hollow, concavity, or saddle of a display substrate, for example as disclosed by U.S. Pat. No. 4,827,186 (Knauer et al.). In a device as disclosed by Wedding ('158), Shinoda et al. ('500), or Knauer et al. ('186), the shells may be conveniently added to the substrate cavities and to the space between opposing electrodes before the device is sealed.

Displays of 40 inches or larger are fragile with risk of breakage during shipment and handling. The presence of the shells inside of the display device adds structural support and integrity to the device. The shells may be sprayed, stamped, pressed, poured, screen-printed, or otherwise applied to the substrate. The substrate surface may contain an adhesive or sticky surface to bind the shell to the substrate. The practice of this invention is not limited to a flat surface display. The shell may be positioned or located on a conformal surface or substrate so as to conform to a predetermined shape such as a curved or irregular surface. In one embodiment, each shell is positioned within a cavity on a single-substrate or monolithic gas discharge structure that has a flexible or bendable substrate. In another embodiment, the substrate is rigid. The substrate may also be partially or semi-flexible.

Substrate

The display device may be comprised of a single substrate or dual substrates. The substrate(s) may be flexible, semi-flexible, or rigid substrates. The substrate may be opaque, transparent, translucent, or non-light transmitting. In some embodiments, there may be used multiple substrates of three or more. Substrates may be flexible films, such as a polymeric film substrate. The flexible substrate may also be made of metallic materials alone or incorporated into a polymeric substrate. Alternatively or in addition, one or both substrates may be made of an optically-transparent thermoplastic polymeric material. Examples of suitable such materials are polycarbonate, polyvinyl chloride, polystyrene, polymethyl methacrylate, polyurethane polyimide, polyester, and cyclic polyolefin polymers. More broadly, the substrates may include a flexible plastic such as a material selected from the group consisting of polyether sulfone (PES), polyester terephihalate, polyethylene terephihalate (PET), polyethylene naphtholate, polycarbonate, polybutylene terephihalate, polyphenylene sulfide (PPS), polypropylene, polyester, aramid, polyamide-imide (PAI), polyimide, aromatic polyimides, polyetherimide, acrylonitrile butadiene styrene, and polyvinyl chloride, as disclosed in U.S. Patent Application Publication 2004/0179145 (Jacobsen et al.), incorporated herein by reference.

Alternatively, one or both of the substrates may be made of a rigid material. For example, one or both of the substrates may be a glass substrate. The glass may be a conventionally-available glass, for example having a thickness of approximately 0.2 mm-1 mm. Alternatively, other suitable transparent materials may be used, such as a rigid plastic or a plastic film. The plastic film may have a high glass transition temperature, for example above 65° C., and may have a transparency greater than 85% at 530 nm.

Further details regarding substrates and substrate materials are found in International Publication Nos. WO 00/46854, WO 00/49421, WO 00/49658, WO 00/55915, and WO 00/55916, the entire disclosures of which are herein incorporated by reference. Apparatus, methods, and compositions for producing flexible substrates are disclosed in U.S. Pat. Nos. 5,469,020 (Herrick), 6,274,508 (Jacobsen et al.), 6,281,038 (Jacobsen et al.), 6,316,278 (Jacobsen et al.), 6,468,638 (Jacobsen et al.), 6,555,408 (Jacobsen et al.), 6,590,346 (Hadley et al.), 6,606,247 (Credelle et al.), 6,665,044 (Jacobsen et al.), and 6,683,663 (Hadley et al.), all incorporated herein by reference.

Positioning of Lumino-Shell on Substrate

Each lumino-shell is positioned or located on the substrate by any appropriate means. In one embodiment, the shell is bonded to the surface of a substrate in a monolithic or dual-substrate display. The shell may be bonded to the substrate surface with a non-conductive, adhesive material which also serves as an insulating barrier to prevent electrically shorting of the conductors or electrodes connected to the shell. Any suitable non-conductive material may be used to bond the lumino-shell to the substrate. In one embodiment, there is used an epoxy resin that is the reaction product of epichlorohydrin and bisphenol-A. One such epoxy resin is a liquid epoxy resin, D. E. R. 383, produced by the Dow Plastics group of the Dow Chemical Company. In one embodiment, the lumino-shell is bonded to the substrate with a conductive material.

The lumino-shell may be mounted or positioned within a substrate well, cavity, hollow, or like depression. The well, cavity, hollow or depression is of suitable dimensions with a mean or average diameter and depth for receiving and retaining the shell. As used herein well includes cavity, hollow, depression, hole, or any similar configuration. In U.S. Pat. No. 4,827,186 (Knauer et al.), there is shown a cavity referred to as a concavity or saddle. The depression, well or cavity may extend partly through the substrate, embedded within or extend entirely through the substrate. The cavity may comprise an elongated channel, trench, or groove extending partially or completely across the substrate.

The electrodes are in electrical contact with each shell. A material such as a conductive adhesive, and/or a conductive filler may be used to bridge or connect the electrode to the shell. Such conductive material is applied so as to not electrically short the electrode to other nearby electrodes. The lumino-shell may be partially or wholly made of a conductive material.

Light Barriers

Light barriers of opaque, translucent, or non-transparent material may be located between display shells to prevent optical cross-talk between shells, particularly between adjacent shells. A black material such as carbon filler is typically used.

Electrically Conductive Bonding Substance

In one embodiment, the conductors or electrodes are electrically connected to each shell with an electrically conductive bonding substance. The electrically conductive bonding substance can be any suitable inorganic or organic material including compounds, mixtures, dispersions, pastes, liquids, cements, and adhesives. In one embodiment, the electrically-conductive bonding substance is an organic substance with conductive filler material. Contemplated organic substances include adhesive monomers, dimers, trimers, polymers and copolymers of materials such as polyurethanes, polysulfides, silicones, and epoxies. A wide range of other organic or polymeric materials may be used. Contemplated conductive filler materials include conductive metals or metalloids such as silver, gold, platinum, copper, chromium, nickel, aluminum, and carbon.

The conductive filler may be of any suitable size and form such as particles, powder, agglomerates, or flakes of any suitable size and shape. It is contemplated that the particles, powder, agglomerates, or flakes may comprise a non-metal, metal, or metalloid core with an outer layer, coating, or film of conductive metal. Some specific embodiments of conductive filler materials include silver-plated copper beads, silver-plated glass beads, silver particles, silver flakes, gold-plated copper beads, gold-plated glass beads, gold particles, gold flakes, and so forth. In one particular embodiment of this invention there is used an epoxy filled with 60% to 80% by weight silver. Examples of electrically conductive bonding substances are well known in the art. The disclosures including the compositions of the following references are incorporated herein by reference. U.S. Pat. No. 3,412,043 (Gilliland) discloses an electrically conductive composition of silver flakes and resinous binder. U.S. Pat. No. 3,983,075 (Marshall et al.) discloses a copper filled electrically conductive epoxy. U.S. Pat. No. 4,247,594 (Shea et al.) discloses an electrically conductive resinous composition of copper flakes in a resinous binder. U.S. Pat. Nos. 4,552,607 (Frey) and 4,670,339 (Frey) disclose a method of forming an electrically conductive bond using copper microspheres in an epoxy. U.S. Pat. No. 4,880,570 (Sanborn et al.) discloses an electrically conductive epoxy-based adhesive selected from the amine curing modified epoxy family with a filler of silver flakes. U.S. Pat. No. 5,183,593 (Durand et al.) discloses an electrically conductive cement comprising a polymeric carrier such as a mixture of two epoxy resins and filler particles selected from silver agglomerates, particles, flakes, and powders. The filler may be silver-plated particles such as inorganic spheroids plated with silver. Other noble metals and non-noble metals such as nickel are disclosed. U.S. Pat. No. 5,298,194 (Carter et al.) discloses an electrically conductive adhesive composition comprising a polymer or copolymer of polyolefins or polyesters filled with silver particles. U.S. Pat. No. 5,575,956 (Hermansen et al.) discloses electrically-conductive, flexible epoxy adhesives comprising a polymeric mixture of a polyepoxide resin and an epoxy resin filled with conductive metal powder, flakes, or non-metal particles having a metal outer coating. The conductive metal is a noble metal such as gold, silver, or platinum. Silver-plated copper beads and silver-plated glass beads are also disclosed. U.S. Pat. No. 5,891,367 (Basheer et al.) discloses a conductive epoxy adhesive comprising an epoxy resin cured or reacted with selected primary amines and filled with silver flakes. The primary amines provide improved impact resistance. U.S. Pat. No. 5,918,364 (Kulesza et al.) discloses substrate bumps or pads formed of electrically conductive polymers filled with gold or silver. U.S. Pat. No. 6,184,280 (Shibuta) discloses an organic polymer containing hollow carbon microfibers and an electrically conductive metal oxide powder. In another embodiment, the electrically-conductive bonding substance is an organic substance without a conductive filler material.

U.S. Pat. No. 5,645,764 (Angelopoulos et al.) discloses electrically conductive pressure sensitive polymers without conductive fillers. Examples of such polymers include electrically conductive substituted and unsubstituted polyanilines, substituted and unsubstituted polyparaphenylenes, substituted and unsubstituted polyparaphenylene vinylenes, substituted and unsubstituted polythiophenes, substituted and unsubstituted polyazines, substituted and unsubstituted polyfuranes, substituted and unsubstituted polypyrroles, substituted and unsubstituted polyselenophenes, substituted and unsubstituted polyphenylene sulfides and substituted and unsubstituted polyacetylenes formed from soluble precursors. Blends of these polymers are suitable for use as are copolymers made from the monomers, dimers, or trimers, used to form these polymers.

Electrically conductive polymer compositions are also disclosed in U.S. Pat. Nos. 5,917,693 (Kono et al.), 6,096,825 (Garnier), and 6,358,438 (Isozaki et al.). The electrically conductive polymers disclosed above may also be used with conductive fillers. In some embodiments, organic ionic materials such as calcium stearate may be added to increase electrical conductivity. See U.S. Pat. No. 6,599,446 (Todt et al.), incorporated by reference. In one embodiment, the electrically conductive bonding substance is luminescent, for example as disclosed in U.S. Pat. No. 6,558,576 (Brielmann et al.), incorporated herein by reference.

EMI/RFI Shielding

In some embodiments, electroductive bonding substances may be used for EMI (electromagnetic interference) and/or RFI (radio-frequency interference) shielding. Examples of such EMI/RFI shielding are disclosed in U.S. Pat. Nos. 5,087,314 (Sandborn et al.) and 5,700,398 (Angelopoulos et al.), both incorporated herein by reference.

Electrodes

One or more shells containing a luminescent substance are located within the display panel structure, each shell being in contact with at least two electrodes. In accordance with one embodiment, the contact is made by an electrically conductive bonding substance applied to each shell so as to form an electrically conductive pad for connection to the electrodes. A dielectric substance may also be used in lieu of or in addition to the conductive substance. Each electrode pad may partially cover the outside shell surface of the shell. The electrodes and pads may be of any geometric shape or configuration. In one embodiment the electrodes are opposing arrays of electrodes, one array of electrodes being transverse or orthogonal to an opposing array of electrodes. The electrode arrays can be parallel, zig zag, serpentine, or like pattern as typically used in dot-matrix displays. The use of split or divided electrodes is contemplated as disclosed in U.S. Pat. Nos. 3,603,836 (Grier) and 3,701,184 (Grier), incorporated herein by reference. Apertured electrodes may be used as disclosed in U.S. Pat. Nos. 6,118,214 (Marcotte) and 5,411,035 (Marcotte) and U.S. Patent Application Publication 2004/0001034 (Marcotte), all incorporated herein by reference. The electrodes are of any suitable conductive metal or alloy including gold, silver, aluminum, or chrome-copper-chrome. If a transparent electrode is used on the viewing surface, this is typically indium tin oxide (ITO) or tin oxide with a conductive side or edge bus bar of silver. Other conductive bus bar materials may be used such as gold, aluminum, or chrome-copper-chrome. The electrodes may partially cover the external surface of the shell.

The electrode array in a display may be divided into two portions and driven from both sides with a dual scan architecture as disclosed in U.S. Pat. Nos. 4,233,623 (Pavliscak) and 4,320,418 (Pavliscak), both incorporated herein by reference.

A flat shell surface is particularly suitable for connecting electrodes to the display shell. If one or more electrodes connect to the bottom of shell, a flat bottom surface is desirable. Likewise, if one or more electrodes connect to the top or sides of the shell, it is desirable for the connecting surface of such top or sides to be flat.

The electrodes may be applied to the substrate or to the shells by thin film methods such as vapor phase deposition, e-beam evaporation, sputtering, conductive doping, etc. or by thick film methods such as screen printing, ink jet printing, etc.

In a matrix display, the electrodes in each opposing transverse array are transverse to the electrodes in the opposing array so that each electrode in each array forms a crossover with an electrode in the opposing array, thereby forming a multiplicity of crossovers. Each crossover of two opposing electrodes forms a discharge point or cell. At least one shell containing luminescent substance is positioned in the display device at the intersection of at least two opposing electrodes. When an appropriate current is applied to an opposing pair of electrodes, the luminescent substance inside of the shell at the crossover is energized and photons of light in the visible and/or invisible range are emitted by the luminescent substance.

Lumino-Shell Geometry

The lumino-shell may be of any suitable volumetric shape or geometric configuration. As used herein, lumino-shell includes lumino-sphere, lumino-disk, and/or lumino-dome. The volumetric and geometric shapes include but are not limited to spherical, oblate spheroid, prolate spheroid, capsular, elliptical, ovoid, egg shape, bullet shape, pear and/or tear drop. In an oblate spheroid, the diameter at the polar axis is flattened and is less than the diameter at the equator. In a prolate spheroid, the diameter at the equator is less than the diameter at the polar axis such that the overall shape is elongated. Likewise, the lumino-shell cross-section may be of any geometric design.

The size of the lumino-shell may vary over a wide range. The average diameter of a lumino-shell is about 1 mil to 20 mils (where one mil equals 0.001 inch) or about 25 microns to 500 microns where 25.4 microns (micrometers) equals 1 mil or 0.001 inch. The lumino-shells can be manufactured up to 80 mils or about 2000 microns in diameter or greater.

The average diameter of the lumino-shells may be varied for different luminescent substances to achieve color balance. Thus for a display device having phosphors which emit red, green, and blue light in the visible range, the lumino-shells for the red phosphor may have an average diameter less than the average diameter of the lumino-shells for the green or blue phosphor. Typically the average diameter of the red phosphor lumino-shells is about 80% to 95% of the average diameter of the green phosphor lumino-shells.

The average diameter of the blue phosphor lumino-shells may be greater than the average diameter of the red or green phosphor lumino-shells. Typically the average shell diameter for the blue phosphor is about 105% to 125% of the average shell diameter for the green phosphor and about 110% to 155% of the average diameter of the red phosphor.

In another embodiment using a high brightness green phosphor, the red and green shell may be reversed such that the average diameter of the green phosphor shell is about 80% to 95% of the average diameter of the red phosphor shell. In this embodiment, the average diameter of the blue shell is about 105% to 125% of the average shell diameter for the red phosphor and about 110% to 155% of the average diameter of the green phosphor.

The red, green, and blue lumino-shells may also have different size diameters so as to enlarge voltage margin and improve luminance uniformity as disclosed in U.S. Patent Application Publication 2002/0041157 A1 (Heo), incorporated herein by reference. The widths of the corresponding electrodes for each RGB shell may be of different dimensions such that an electrode is wider or more narrow for a selected phosphor as disclosed in U.S. Pat. No. 6,034,657 (Tokunaga et al.), incorporated herein by reference. There also may be used combinations of different geometric shapes for different colors. Thus there may be used a square cross section shell for one color, a circular cross-section for another color, and another geometric cross section for a third color. A combination of shells of different geometric shape, i.e., lumino-spheres, lumino-disks, and lumino-domes, may be used as different pixels in a display device.

Organic Luminescent Substance

An organic luminescent substance is contained by each lumino-shell so as to be excited by electric current and emit visible and/or invisible light. The organic luminescent substance comprises one or more organic compounds, monomers, dimers, trimers, polymers, copolymers, or like organic materials which emit visible and/or invisible light when excited by electric current. Such organic luminescent substance may include one or more organic luminescent phosphors selected from organic luminescent compounds, organic luminescent monomers, dimers, trimers, polymers, copolymers, organic luminescent dyes, organic luminescent dopants, and/or any other organic luminescent material, collectively referred to herein as organic luminescent phosphor.

Organic luminescent phosphor substances contemplated herein include those organic light emitting diodes or devices (OLED) and organic electroluminescent (EL) materials which emit light when excited an electric current.

OLED and organic EL substances include the small molecule organic EL and the large molecule or polymeric OLED.

Small molecule organic EL substances are disclosed in U.S. Pat. Nos. 4,720,432 (VanSlyke et al.), 4,769,292 (Tang et al.), 5,151,629 (VanSlyke), 5,409,783 (Tang et al.), 5,645,948 (Shi et al.), 5,683,823 (Shi et al.), 5,755,999 (Shi et al.), 5,908,581 (Chen et al.), 5,935,720 (Chen et al.), 6,020,078 (Chen et al.), 6,069,442 (Hung et al.), 6,348,359 (VanSlyke et al.), and 6,720,090 (Young et al.), all incorporated herein by reference. The small molecule organic light emitting devices may be called SMOLED.

Large molecule or polymeric OLED substances are disclosed in U.S. Pat. Nos. 5,247,190 (Friend et al.), 5,399,502 (Friend et al.), 5,540,999 (Yamamoto et al.), 5,900,327 (Pei et al.), 5,804,836 (Heeger et al.), 5,807,627 (Friend et al.), 6,361,885 (Chou), and 6,670,645 (Grushin et al.), all incorporated herein by references. The polymer light emitting devices may be called PLED.

Organic luminescent substances also include OLEDs doped with phosphorescent compounds as disclosed in U.S. Pat. No. 6,303,238 (Thompson et al.), incorporated herein by reference.

Organic photoluminescent substances are also disclosed in U.S. Patent Application Publication Nos. 2002/0101151 (Choi et al.), 2002/0063525 (Choi et al.), 2003/0003225 (Choi et al.), and U.S. 2003/0052595 (Yi et al.); U.S. Pat. Nos. 6,610,554 (Yi et al.), and 6,692,326 (Choi et al.); and International Publications WO 02/104077 and WO 03/046649, all incorporated herein by reference.

In one embodiment, the organic luminescent phosphorous substance is a color-conversion-media (CCM) such as the fluorescent organic dye compounds.

In another embodiment, the organic luminescent substance is selected from a condensed or fused ring system such as a perylene compound, a perylene based compound, a perylene derivative, a perylene based monomer, dimer or trimer, a perylene based polymer and/or copolymer, and/or a substance doped with a perylene. Luminescent perylene phosphor substances are widely known in the prior art. U.S. Pat. No. 4,968,571 (Gruenbaum et al.), incorporated herein by reference, discloses perylene materials which may be used as luminescent phosphorous substances. U.S. Pat. No. 5,693,808 (Langhals), incorporated herein by reference, discloses the preparation of luminescent perylene dyes.

U.S. Patent Application Publication 2004/0009367 (Hatwar), incorporated here by reference, discloses the preparation of luminescent materials doped with fluorescent perylene dyes. U.S. Pat. No. 6,528,188 (Suzuki et al.), incorporated herein by reference, discloses the preparation and use of luminescent perylene compounds.

Condensed or fused ring compounds are conjugated with multiple double bonds and include monomers, dimers, trimers, polymers, and copolymers. In addition, conjugated aromatic and aliphatic organic compounds are contemplated including monomers, dimers, trimers, polymers, and copolymers. Conjugation as used herein also includes extended conjugation. Typically the number of conjugate-double bonds ranges from about 4 to about 15.

Examples of conjugate-bonded or condensed/fused benzene rings are disclosed in U.S. Pat. Nos. 6,614,175 (Aziz et al.) and 6,479,172 (Hu et al.), both incorporated herein by reference. U.S. Patent Application Publication 2004/0023010 (Bulovic et al.) discloses luminescent nanocrystals with organic polymers including conjugated organic polymers. Cumulene is conjugated only with carbon and hydrogen atoms. Cumulene becomes more deeply colored as the conjugation is extended.

Other condensed or fused ring luminescent compounds may also be used including naphthalimides, substituted naphthalimides, naphthalimide monomers, dimers, trimers, polymers, copolymers and derivatives thereof including naphthalimide diester dyes such as disclosed in U.S. Pat. No. 6,348,890 (Likavec et al.), incorporated herein by reference.

In one embodiment, there is used fluorescent dye doped OLEDs. In another embodiment, there is used a phosphorescent dye/dopant.

The organic luminescent substance may be an organic lumophore, for example as disclosed in U.S. Pat. Nos. 5,354,825 (Klainer et al.), 5,480,723 (Klainer et al.), 5,700,897 (Klainer et al.), and 6,538,263 (Park et al.), all incorporated by reference. Also lumophores are disclosed in S. E. Shaheen et al., Journal of Applied Physics, Vol. 84, Number 4, pages 2324 to 2327, Aug. 15, 1998; J. D. Anderson et al., Journal American Chemical Society 1998, Vol. 120, pages 9646 to 9655; and Gyu Hyun Lee et al., Bulletin of Korean Chemical Society, 2002, Vol. 23, No. 3, pages 528 to 530, all incorporated herein by reference.

The organic luminescent substance may be applied by any suitable method to the external surface of the shell, to the substrate or to any location in close proximity to the shell so as to be excited by the electric current. Methods of application include thin film deposition including vapor phase deposition, sputtering and E-beam evaporation. Also thick film or application methods may be used such as screen-printing, ink jet printing, and/or slurry techniques.

Small size molecule OLED materials are typically deposited upon the external surface of the shell by thin film deposition methods such as vapor phase deposition or sputtering. Large size molecule or polymeric OLED materials are deposited by so called thick film or application methods such as screen-printing, ink jet, and/or slurry techniques.

If the organic luminescent substance such as an electroluminescent phosphor is applied to the external surface of the lumino-shell, it may be applied as a continuous or discontinuous layer or coating such that the shell is completely or partially covered with the luminescent substance.

Inorganic Luminescent Substances

The organic luminescent substances may be used in combination with inorganic luminescent substances. Contemplated combinations include mixtures and/or selective layers of organic and/or inorganic substances. The inorganic luminescent material may be dispersed within an organic luminescent material or vice versa. The shell may be made of an inorganic luminescent substance. Typical inorganic luminescent substances are as follows.

Green Phosphor

A green light-emitting phosphor may be used alone or in combination with other light-emitting phosphors such as blue or red. Phosphor materials which emit green light include $Zn_2SiO_4$:Mn, ZnS:Cu, ZnS:Au, ZnS:Al, ZnO:Zn, CdS:Cu, $CdS:Al_2$, $Cd_2O_2S$:Tb, and $Y_2O_2S$:Tb.

In one embodiment, there is used a green light-emitting phosphor selected from the zinc orthosilicate phosphors such as $ZnSiO_4:Mn^{2+}$. Green light-emitting zinc orthosilicates including the method of preparation are disclosed in U.S. Pat. No. 5,985,176 (Rao) which is incorporated herein by reference.

In another embodiment, a terbium activated yttrium gadolinium borate phosphor such as (Gd, Y) $BO_3:Tb^{3+}$. Green light-emitting borate phosphors including the method of preparation are disclosed in U.S. Pat. No. 6,004,481 (Rao), which is incorporated herein by reference.

In another embodiment, there is used a manganese activated alkaline earth aluminate green phosphor as disclosed in U.S. Pat. No. 6,423,248 (Rao et al.). The particle size ranges from 0.05 to 5 microns. Rao et al. ('248) is incorporated herein by reference.

Terbium doped phosphors may emit in the blue region especially in lower concentrations of terbium. For some display applications such as television, it is desirable to have a single peak in the green region at 543 nm. By incorporating a blue absorption dye in a filter, a blue peak can be eliminated. Green light-emitting terbium-activated lanthanum cerium orthophosphate phosphors are disclosed in U.S. Pat. No. 4,423,349 (Nakajima et al.) which is incorporated herein by reference. Green light-emitting lanthanum cerium terbium phosphate phosphors are disclosed in U.S. Pat. No. 5,651,920 (Chau et al.) which is incorporated herein by reference.

Green light-emitting phosphors may also be selected from the trivalent rare earth ion-containing aluminate phosphors as disclosed in U.S. Pat. No. 6,290,875 (Oshio et al.).

Blue Phosphor

A blue light-emitting phosphor may be used alone or in combination with other light-emitting phosphors such as green or red. Phosphor materials which emit blue light include ZnS:Ag, ZnS:Cl, and CsI:Na. In one embodiment, there is used a blue light-emitting aluminate phosphor. An aluminate phosphor that emits blue visible light is divalent europium ($Eu^{2+}$) activated Barium Magnesium Aluminate (BAM) represented by $BaMgAl_{10}O_{17}:Eu^{2+}$. BAM is widely used as a blue phosphor in the display industry.

BAM and other aluminate phosphors which emit blue visible light are disclosed in U.S. Pat. Nos. 5,611,959 (Kijima et al.) and 5,998,047 (Bechtel et al.), both incorporated herein by reference. The aluminate phosphors may also be selectively coated as disclosed by Bechtel et al. ('047). Blue light-emitting phosphors may be selected from a number of divalent europium-activated aluminates such as disclosed in U.S. Pat. No. 6,096,243 (Oshio et al.) incorporated herein by reference. The preparation of BAM phosphors for a PDP is also disclosed in U.S. Pat. No. 6,045,721 (Zachau et al.), incorporated herein by reference.

In another embodiment, the blue light-emitting phosphor is thulium activated lanthanum phosphate with trace amounts of $Sr^{2+}$ and/or $Li^+$. Blue light-emitting phosphate phosphors including the method of preparation are disclosed in U.S. Pat. No. 5,989,454 (Rao) which is incorporated herein by reference.

In one embodiment, a mixture or blend of blue emitting phosphors is used such as a blend or complex of about 85% to 70% by weight of a lanthanum phosphate phosphor activated by trivalent thulium ($Tm^{3+}$), $Li^+$, and an optional amount of an alkaline earth element ($AE^{2+}$) as a coactivator and about 15% to 30% by weight of divalent europium-activated BAM phosphor or divalent europium-activated Barium Magnesium, Lanthanum Aluminated (BLAMA) phosphor. Such a mixture is disclosed in U.S. Pat. No. 6,187,225 (Rao), incorporated herein by reference.

Blue light-emitting phosphors also include $ZnO.Ga_2O_3$ doped with Na or Bi. The preparation of these phosphors is disclosed in U.S. Pat. Nos. 6,217,795 (Yu et al.) and 6,322,725 (Yu et al.), both incorporated herein by reference. Other blue light-emitting phosphors include europium activated strontium chloroapatite and europium-activated strontium calcium chloroapatite.

Red Phosphor

A red light-emitting phosphor may be used alone or in combination with other light-emitting phosphors such as green or blue. Phosphor materials which emit red light include $Y_2O_2S:Eu$ and $Y_2O_3S:Eu$.

In one embodiment, there is used a red light-emitting phosphor which is an europium activated yttrium gadolinium borate phosphors such as $(Y,Gd)BO_3:Eu^{3+}$. The composition and preparation of these red light-emitting borate phosphors is disclosed in U.S. Pat. Nos. 6,042,747 (Rao) and 6,284,155 (Rao), both incorporated herein by reference.

These europium activated yttrium, gadolinium borate phosphors emit an orange line at 593 nm and red emission lines at 611 nm and 627 nm when excited by 147 nm and 173 nm UV radiation from the discharge of a xenon gas mixture. For television (TV) applications, it is preferred to have only the red emission lines (611 nm and 627 nm). The orange line (593 nm) may be minimized or eliminated with an external optical filter. A wide range of red-emitting phosphors are used in the display industry and are contemplated in the practice of this invention including europium-activated yttrium oxide.

Other Phosphors

There also may be used phosphors other than red, blue, green such as a white light-emitting phosphor, pink light-emitting phosphor or yellow light-emitting phosphor. These may be used with an optical filter. Phosphor materials which emit white light include calcium compounds such as $3Ca_3(PO_4)_2.CaF:Sb$, $3Ca_3(PO_4)_2.CaF:Mn$, $3Ca_3(PO_4)_2.CaCl:Sb$, and $3Ca_3(PO_4)_2.CaCl:Mn$. White light-emitting phosphors are disclosed in U.S. Pat. No. 6,200,496 (Park et al.) incorporated herein by reference. Pink light-emitting phosphors are disclosed in U.S. Pat. No. 6,200,497 (Park et al.) incorporated herein by reference. Phosphor material which emits yellow light include ZnS:Au.

Organic and Inorganic Luminescent Materials

Inorganic and organic luminescent materials may be used in any suitable combinations. In one embodiment, multiple layers of luminescent materials are applied to the lumino-shell with at least one layer being organic and at least one layer being inorganic. An inorganic layer may serve as a protective overcoat for an organic layer.

In one embodiment, organic and inorganic luminescent materials are mixed together and applied as a layer inside or outside the shell. The lumino-shell may also be made of or contain a mixture of organic and inorganic luminescent materials. In one embodiment, a mixture of organic and inorganic material is applied outside the shell. Inorganic luminescent material may be mixed or dispersed within an organic luminescent material. Organic luminescent material may be mixed or dispersed within an inorganic luminescent material.

Up-Conversion

In one embodiment, it is contemplated using an inorganic and/or organic luminescent substance as an up-conversion phosphor. The up-conversion phosphor is typically used in combination with a phosphor which converts UV radiation to visible light. An up-conversion phosphor in combination with such a UV phosphor is disclosed in U.S. Pat. No. 6,265,825 (Asano), incorporated herein by reference. Up-conversion may also be obtained with shell compositions such as Thulium doped silicate glass containing oxides of Si, Al, and La, as disclosed in U.S. Patent Application Publication 2004/0037538 (Schardt et al.), incorporated herein by reference. The glasses of Schardt et al. emit visible or UV light when excited by IR.

Down-conversion

The luminescent material may also include down-conversion materials such as phosphors as disclosed in U.S. Pat. No. 3,838,307 (Masi), incorporated herein by reference. Down-conversion luminescent materials are also disclosed in U.S. Pat. Nos. 6,013,538 (Burrows et al.), 6,091,195 (Forrest et al.), 6,208,791 (Bischel et al.), 6,566,156 (Sturm et al.), and 6,650,045 (Forrest et al.). Down-conversion luminescent materials are also disclosed in U.S. Patent Application Publication Nos. 2004/0159903 (Burgener, II et al.), 2004/0196538 (Burgener, II et al.), 2005/0093001 (Liu et al.), 2005/0094109 (Sun et al.), and European Patent 0143034 (Maestro et al.), incorporated herein by reference. The shell may be constructed wholly or in part from a down-conversion material, up-conversion material or a combination of both.

Quantum Dots

In one embodiment, the luminescent substance is a quantum dot material. Examples of luminescent quantum dots are disclosed in International Publication Numbers WO 03/038011, WO 00/029617, WO 03/038011, WO 03/100833, and WO 03/037788, all incorporated herein by reference. Luminescent quantum dots are also disclosed in U.S. Pat. No. 6,468,808 (Nie et al.), U.S. Pat. No. 6,501,091 (Bawendi et al.), U.S. Pat. No. 6,698,313 (Park et al.), and U.S. Patent Application Publication 2003/0042850 (Bertram et al.), all incorporated herein by reference. The quantum dots may be added or incorporated into the shell during shell formation or after the shell is formed.

Protective Overcoat

Organic luminescent phosphors are particularly suitable for placing on the exterior shell surface, but may require a protective overcoat. The protective overcoat may be inorganic, organic, or a combination of inorganic and organic. This protective overcoat may be an inorganic and/or organic luminescent material.

The luminescent substance may have a protective overcoat such as a clear or transparent acrylic compound including acrylic solvents, monomers, dimers, trimers, polymers, copolymers, and derivatives thereof to protect the luminescent substance from direct or indirect contact or exposure with environmental conditions such as air, moisture, sunlight, handling, or abuse. The selected acrylic compound is of a viscosity such that it can be conveniently applied by spraying, screen print, ink jet, or other convenient methods so as to form a clear film or coating of the acrylic compound over the luminescent substance.

Other organic compounds may also be suitable as protective overcoats including silanes such as glass resins. Also the polyesters such as Mylar® may be applied as a spray or a sheet fused under vacuum to make it wrinkle free. Polycarbonates may be used but may be subject to UV absorption and detachment.

In one embodiment, the luminescent substance is coated with a film or layer of a perylene compound including monomers, dimers, trimers, polymers, copolymers, and derivatives thereof. The perylene compounds are widely used as protective films. Specific compounds include poly-monochloro-para-xylyene (Parylene C) and poly-para-xylylene (Parylene N).

Parylene polymer films are also disclosed in U.S. Pat. Nos. 5,879,808 (Wary et al.) and U.S. Pat. No. 6,586,048 (Welch Jr. et al.), both incorporated herein by reference. The perylene compounds may be applied by ink jet printing, screen printing, spraying, and so forth as disclosed in U.S. Patent Application Publication 2004/0032466 (Deguchi et al.), incorporated herein by reference. Parylene conformal coatings are covered by Mil-I-46058C and ISO 9002. Parylene films may also be induced into fluorescence by an active plasma as disclosed in U.S. Pat. No. 5,139,813 (Yira et al.), incorporated herein by reference.

Phosphor overcoats are also disclosed in U.S. Pat. Nos. 4,048,533 (Hinson et al.), 4,315,192 (Skwirut et al.), 5,592,052 (Maya et al.), 5,604,396 (Watanabe et al.), 5,793,158 (Wedding), and 6,099,753 (Yoshimura et al.), all incorporated herein by reference.

In some embodiments, the organic luminescent substance is selected from materials that do not degrade when exposed to oxygen, moisture, sunlight, etc. and that may not require a protective overcoat. Such include various organic luminescent substances such as the perylene compounds disclosed above. For example, perylene compounds may be used as protective overcoats and thus do not require a protective overcoat.

Tinted Shells

The lumino-shell may be color tinted or constructed of materials that are color tinted with red, blue, green, yellow, or like pigments. This is disclosed in U.S. Pat. No. 4,035,690 (Roeber) cited above. The use of tinted materials may be used in combination with the above described phosphors and the light emitted from such phosphors. Optical filters may also be used.

Filters

This invention may be practiced in combination with an optical and/or electromagnetic (EMI) filter, screen, and/or shield. It is contemplated that the filter, screen, and/or shield may be positioned on a display constructed of the lumino-shells, for example on the front or top-viewing surface. The shells may be tinted. Examples of optical filters, screens, and/or shields are disclosed in U.S. Pat. Nos. 3,960,754 (Woodcock), 4,106,857 (Snitzer), 4,303,298, (Yamashita), 5,036,025 (Lin), 5,804,102 (Oi), and 6,333,592 (Sasa et al.), all incorporated herein by reference. Examples of EMI filters, screens, and/or shields are disclosed in U.S. Pat. Nos. 6,188,174 (Marutsuka) and 6,316,110 (Anzaki et al.), incorporated herein by reference. Color filters may also be used. Examples are disclosed in U.S. Pat. Nos. 3,923,527 (Matsuura et al.), 4,105,577 (Yamashita), 4,110,245 (Yamashita), and 4,615,989 (Ritze), all incorporated by reference.

Layers of Luminescent Materials

Two or more layers of the same or different luminescent materials may be selectively applied to the lumino-shells. Such layers may comprise combinations of organic and organic, inorganic and inorganic, and/or inorganic and organic.

Combinations of Shells with Different Geometry

The display may comprise shells of varying geometry. Disks, spheres, and domes may be used alone or in combination with other shells. The shells of one geometry may be used with selected luminescent materials to provide one color while shells of other geometric shapes are used with selected luminescent materials to provide other colors.

High Resolution Color Display

In a multicolor display, shells with flat sides such as disks may be stacked on top of each other or arranged in parallel side-by-side positions on the substrate. This configuration requires less area of the display surface compared to conventional RGB displays that require red, green, and blue pixels adjacent to each other on the substrate. This stacking embodiment may be practiced with shells that use various color. Each shell may also be of a different color material such as tinted glass. The shells used in this stacking arrangement typically have geometric shapes with one or more flat sides such as disks and/or domes.

Elongated Tubes

The display structure may comprise a combination of lumino-shells and elongated tubes. Elongated tubes are disclosed in U.S. Pat. Nos. 3,602,754 (Pfaender et al.), 3,654,680 (Bode et al.), 3,927,342 (Bode et al.), 4,038,577 (Bode et al.), 3,969,718 (Strom), 3,990,068 (Mayer et al.), 4,027,188 (Bergman), 5,984,747 (Bhagavatula et al.), 6,255,777 (Kim et al.), 6,633,117 (Shinoda et al.), 6,650,055 (Ishimoto et al.), and 6,677,704 (Ishimoto et al.).

The elongated tube is intended to include capillary, filament, filamentary, illuminator, hollow rod, or other such terms. It includes an elongated structure having a length dimension that is greater than its cross-sectional width dimension. The width of the elongated tube is the viewing width from the top or bottom (front or rear) of the display.

The length of each elongated tube may vary depending upon the display structure. In one embodiment hereof, an elongated tube is selectively divided into a multiplicity of lengths. In another embodiment, there is used a continuous tube that winds or weaves back and forth from one end to the other end of the display. The length of the elongated tube is typically about 1400 microns to several feet or more.

The display may comprise any suitable combination of shells and elongated tubes. The elongated tubes may be arranged in any configuration. In one embodiment, there are alternative rows of shells and elongated tubes.

The elongated tubes may be of any geometric cross-section including circular, elliptical, square, rectangular, triangular, polygonal, trapezoidal, pentagonal, or hexagonal. In one embodiment, the viewing surface of the elongated tube is flat. In another embodiment, each electrode-connecting surface such as top, bottom, and/or side(s) is flat. The elongated tube may contain luminescent materials, and reflective materials. The elongated tubes may also utilize positive column discharge.

Uses for Lumino-shells

Lumino-shells may be used for a variety of applications including display applications such as computer monitors, TV, signage, and radiation detection including microwave and x-ray detection, and antenna.

SUMMARY

The foregoing description of various preferred embodiments of the invention has been presented for purposes of illustration and description. It is not intended to be exhaustive or to limit the invention to the precise forms disclosed. Obvious modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims to be interpreted in accordance with the breadth to which they are fairly, legally, and equitably entitled.

The invention claimed is:

1. In a display device comprised of one or more pixels, the improvement wherein each pixel is defined by an encapsulated shell containing an organic luminescent substance which produces visible or invisible light when excited by voltage or electrical current applied to the shell each shell being positioned on a single substrate, said organic luminescent substance being selected from at least one member of the group consisting of organic photoluminescent monomers, dimers, trimers, organic photoluminescent polymers, copolymers, organic photoluminescent dyes, and organic photoluminescent dopants.

2. The invention of claim 1 wherein the organic luminescent substance is a fluorescent perylene dye.

3. The invention of claim 1 wherein an organic luminescent substance is located near or on the external surface of each shell.

4. The invention of claim 1 wherein the display contains one or more elongated tubes.

5. The invention of claim 1 wherein the organic luminescent substance is a small molecule organic electroluminescent material.

6. The invention of claim 1 wherein the organic luminescent substance is a large molecule organic light emitting diode material.

7. The invention of claim 1 wherein the organic luminescent substance is a polymeric light emitting diode material.

8. The invention of claim 1 wherein the organic luminescent substance is conjugated with multiple double bonds.

9. Then invention of claim 1 wherein the organic luminescent substance is an organic lumophore.

10. The invention of claim 1 wherein the organic luminescent substance is a luminescent perylene.

11. The invention of claim 1 wherein the organic luminescent substance is a perylene compound, perylene based compound, perylene based monomer, dimer, trimer, perylene based polymer, copolymer, and/or substance doped with perylene.

* * * * *